(12) United States Patent
Chien et al.

(10) Patent No.: US 7,615,445 B2
(45) Date of Patent: Nov. 10, 2009

(54) METHODS OF REDUCING COUPLING BETWEEN FLOATING GATES IN NONVOLATILE MEMORY

(75) Inventors: Henry Chien, San Jose, CA (US);
George Matamis, San Jose, CA (US);
Tuan Pham, San Jose, CA (US);
Masaaki Higashitani, Cupertino, CA (US); Hidetaka Horiuchi, Nagoya (JP);
Jeffrey W. Lutze, San Jose, CA (US);
Nima Mokhlesi, Los Gatos, CA (US);
Yupin Kawing Fong, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 224 days.

(21) Appl. No.: 11/534,135

(22) Filed: Sep. 21, 2006

(65) Prior Publication Data
US 2008/0076217 A1 Mar. 27, 2008

(51) Int. Cl.
*H01L 21/336* (2006.01)
(52) U.S. Cl. .................. 438/257; 438/264; 438/279; 257/E29.112; 257/E29.129
(58) Field of Classification Search ......... 438/257–265, 438/279–284; 257/315–320, E29.112, E29.129
See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,297,148 A | 3/1994 | Harari et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,389,808 A | 2/1995 | Arai | |
| 5,661,053 A | 8/1997 | Yuan | |
| 5,712,180 A | 1/1998 | Guterman et al. | |
| 5,923,976 A | 7/1999 | Kim | |
| 6,046,935 A | 4/2000 | Takeuchi | 365/185.03 |
| 6,103,573 A | 8/2000 | Harari et al. | |

(Continued)

FOREIGN PATENT DOCUMENTS

DE 19617632 A1 7/1997

(Continued)

OTHER PUBLICATIONS

Partial international search report dated Apr. 2, 2008 in PCT Application No. PCT/US2007/076163.

(Continued)

*Primary Examiner*—Ha Tran T Nguyen
*Assistant Examiner*—Daniel Whalen
(74) *Attorney, Agent, or Firm*—Vierra Magen Marcus & DeNiro LLP

(57) ABSTRACT

A nonvolatile memory array includes floating gates that have an inverted-T shape in cross section along a plane that is perpendicular to the direction along which floating cells are connected together to form a string. Adjacent strings are isolated by shallow trench isolation structures. An array having inverted-T shaped floating gates may be formed in a self-aligned manner.

11 Claims, 13 Drawing Sheets

U.S. PATENT DOCUMENTS

| | | | |
|---|---|---|---|
| 6,151,248 | A | 11/2000 | Harari et al. |
| 6,222,762 | B1 | 4/2001 | Guterman et al. |
| 6,228,716 | B1 | 5/2001 | Wanlass |
| 6,281,075 | B1 | 8/2001 | Yuan et al. |
| 6,297,097 | B1 | 10/2001 | Jeong |
| 6,492,227 | B1 | 12/2002 | Wang et al. |
| 6,713,834 | B2 | 3/2004 | Mori et al. |
| 6,806,132 | B2 * | 10/2004 | Mori et al. .................. 438/221 |
| 6,888,755 | B2 | 5/2005 | Harari |
| 6,908,817 | B2 | 6/2005 | Yuan |
| 7,026,684 | B2 | 4/2006 | Sakuma et al. |
| 7,071,511 | B2 | 7/2006 | Sakuma et al. |
| 7,078,763 | B2 | 7/2006 | Arai et al. |
| 7,105,406 | B2 | 9/2006 | Lutze et al. |
| 2002/0093073 | A1 | 7/2002 | Mori et al. |
| 2004/0164340 | A1 | 8/2004 | Arai et al. |
| 2005/0003616 | A1 * | 1/2005 | Lutze et al. .................. 438/258 |
| 2005/0087795 | A1 | 4/2005 | Sakuma et al. |
| 2005/0199939 | A1 | 9/2005 | Lutze et al. |
| 2005/0212034 | A1 | 9/2005 | Sasago et al. |
| 2006/0006477 | A1 * | 1/2006 | Hashimi et al. ............. 257/382 |
| 2006/0018181 | A1 | 1/2006 | Matsunaga et al. |
| 2006/0060911 | A1 | 3/2006 | Sakuma et al. |
| 2006/0292802 | A1 * | 12/2006 | Lee et al. .................... 438/264 |
| 2007/0047304 | A1 | 3/2007 | Lee et al. ................ 365/185.05 |
| 2007/0138535 | A1 | 6/2007 | Higashitani ................. 257/315 |
| 2008/0035983 | A1 * | 2/2008 | Sandhu et al. ............. 257/316 |

FOREIGN PATENT DOCUMENTS

| | | | |
|---|---|---|---|
| WO | 2005001922 | A | 1/2005 |

OTHER PUBLICATIONS

Office Action dated Apr. 15, 2008, U.S. Appl. No. 11/534,139, filed Sep. 21, 2006.

USPTO, Office Action mailed in related U.S. Appl. No. 11/534,139 on Oct. 3, 2007, 10 pages.

U.S. Appl. No. 11/534,139, filed Sep. 15, 2006, Chien, et al.

International Preliminary Report on Patentability and Written Opinion Dated Mar. 24, 2009, PCT Application No. PCT/US2007/0716163.

Chien et al., "Nonvolatile Memory with Reduced Coupling Between Floating Gates," U.S. Appl. No. 11/354,139, filed Sep. 21, 2006, 43 pages.

Hamada et al., "Thin Inter-Polyoxide Films for Flash Memories Grown at Low Temperature (400° C) by Oxygen Radicals," IEEE Electron Device Letters, vol. 22, No. 9, Sep. 2001, pp. 423-425.

Hirayama et al., "Low-Temperature Growth of High-Integrity Silicon Oxide Films by Oxygen Radical Generated in High-Density Krypton Plasma," IEDM 99, 0-7803-5410-9/99, 1999 IEEE, pp. 249-252 (10.3.1-10.3.4).

Higashitani, "Flash Devices With Shared Word Lines," U.S. Appl. No. 11/316,654, filed Dec. 21, 2005, 48 pages.

Keeney, "A 130nm Generation High Density Etox™ Flash Memory Technology," 2001 IEEE, 0-7803-7052-X/01, 4 pages.

Ohmi et al., "New Paradigm of Silicon Technology," Invited Paper, Proceedings of the IEEE, vol. 89, No. 3, Mar. 2001, pp. 394-412.

Ohtsubo et al., "Low Temperature Growth (400° C) of High-Integrity Thin Silicon-Oxynitride Films by Microwave-Excited high-Density Kr/O2/NH3 Plasma," pp. 166-169.

Sekine et al., "Highly Robust Ultrathin Silicon Nitride Films Grown at Low-Temperature by Microwave-Excitation High-Density Plasma for Giga Scale Integration," IEEE Transactions on Electron Devices, vol. 47, No. 7, Jul. 2000, pp. 1370-1374.

Sekine et al., "Highly Reliable Ultrathin Silicon Oxide Film Formation at Low Temperature by Oxygen Radical Generated in High-Density Krypton Plasma," IEEE Trnasactions on Electron Devices, vol. 48, No. 8, Aug. 2001, pp. 1550-1555.

Sugawa et al., "Advantage of Silicon Nitride Gate Insulator Transistor by using Microwave-Excited Hig-Density Plasma for applying 100nm Technology Node," 2001 IEEE, 0-7803-7052-X/01, 4 pages.

* cited by examiner

METHODS OF REDUCING COUPLING BETWEEN FLOATING GATES IN NONVOLATILE MEMORY

CROSS-REFERENCE TO RELATED APPLICATION

This application is related to U.S. patent application Ser. No. 11/534,139, entitled, "Nonvolatile Memory with Reduced Coupling Between Floating Gates," filed on the same day as the present application; which application is incorporated in its entirety by reference as if fully set forth herein.

BACKGROUND OF THE INVENTION

This invention relates generally to non-volatile flash memory systems, and, more specifically, to the structures of memory cells and arrays of memory cells, and to the process of forming them. All patents, patent applications and other documents cited in the present application are hereby incorporated by reference in their entirety.

There are many commercially successful non-volatile memory products being used today, particularly in the form of small form factor cards, which use an array of flash EEPROM (Electrically Erasable and Programmable Read Only Memory) cells. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be over driven so that the current flowing through a string is dependent upon the level of charge stored in the addressed cell. An example of a NAND architecture array and its operation as part of a memory system is found in U.S. Pat. No. 6,046,935.

In another type of array having a "split-channel" between source and drain diffusions, the floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, 5,661,053, and 6,281,075.

A modification of this split-channel flash EEPROM cell adds a steering gate that provides a strong capacitive coupling to the floating gate without having direct control of the channel. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). For source side injection programming, efficient programming is obtained by driving the select gate just barely (by for example 0.5V) about its threshold voltage, whereas the steering gate voltage will be incrementally increased from one programming pulse to the next, with verify and lockout operation performed in between programming pulses. The use of steering gates in a flash EEPROM array is described, for example, in U.S. Pat. Nos. 5,313,421 and 6,222,762.

In any of the types of memory cell arrays described above, the floating gate of a cell is programmed by injecting electrons from the substrate to the floating gate. This is accomplished by having the proper doping in the channel region and applying the proper voltages to the source, drain and remaining gate(s).

Two techniques for removing charge from floating gates to erase memory cells are used in the three types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the second type of cell described above, a third erase gate is provided for that purpose. In the third type of cell described above, which already has three gates because of the use of a steering gate, the floating gate is erased to the word line, without the necessity to add a fourth gate. Although this latter technique adds back a second function to be performed by the word line, these functions are performed at different times, thus avoiding the necessity of making a compromise because of the two conflicting requirements. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148.

As in most integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Another flash EEPROM architecture utilizes a dual floating gate memory cell along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. Examples of this cell array architecture and operating techniques are described in U.S. Pat. Nos. 5,712,180, 6,103,573 and 6,151,248.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063. The approach described in that patent is to make the floating gates thicker than usual to provide large vertical surfaces that may be coupled with the control gates. Another approach that increases area coupling a floating gate and a control gate is described by Yuan in U.S. Pat. No. 6,908,817.

When increasing the vertical coupling areas between adjacent floating and control gates, it is further desirable to do so in a manner that does not increase the area of the substrate that is occupied by each cell. Also, it is preferable to reduce the floating gate to floating gate coupling, so that adjacent floating gates do not greatly affect each other.

SUMMARY OF THE INVENTION

A nonvolatile memory array stores charge in floating gates that have an inverted-T shape in cross section along the word line direction. This shape reduces coupling between adjacent floating gates in the bit line direction because of the reduced area of opposing floating gate facets in the bit line direction. The reduction in the dimension of the upper portion of such a floating gate, compared to a floating gate with a rectangular shape, provides more space for a control gate and dielectric layer between adjacent floating gates in the word line direction. A memory array with floating gates having an inverted-T shape may be produced using various processes.

One process for forming an inverted-T shaped floating gate forms STI structures and channel regions that extend in the bit line direction using masking portions. By forming masking portions using resist slimming, channel regions are made narrower than STI structures. Channels may also be narrower than the minimum feature size (F) of the lithographic process used. Subsequently, a first floating gate layer is formed and additional masking portions with sidewall spacers are used to pattern the first floating gate layer into first floating gate portions that are wider than underlying channel regions (and may be wider than F), thus providing a high tolerance for misalignment between the first floating gate portions and channel regions. Subsequently, yet another set of masking portions and sidewall spacers is formed so that slots between sidewall spacers extend from first floating gate portions. Second floating gate portions are formed in the slots. Subsequently, a dielectric layer and control gate layer are formed over the floating gates and an etch is performed to separate the control gate layer into word lines and, at the same time, separate floating gate portions into individual floating gates.

Another process for forming an inverted-T shaped floating gate forms a first floating gate layer and then uses masking portions over the first floating gate layer to establish locations for STI structures so that STI structures are self aligned to first floating gate portions formed from the first floating gate layer. STI structures have sidewalls that extend vertically to a level higher than first floating gate portions. Sidewall spacers are formed on these sidewalls so that sidewall spacers leave slots over first floating gate portions. Second floating gate portions are formed in these slots so that they are self aligned to the first floating gate portions. Subsequently, sidewall spacers are removed and STI structures are partially etched back. A dielectric layer and a control gate layer are deposited over the floating gate portions. The dielectric layer, control gate layer and floating gate portions are then etched together so that word lines are formed that are self aligned to floating gates.

Another process for forming an inverted-T shaped floating gate forms a floating gate layer with masking portions extending in the bit line direction. The floating gate layer is partially etched using the masking portions to cover parts of the floating gate layer that then form vertical projections when unmasked portions of the floating gate layer are removed. The floating gate layer is not etched through by this partial etching. Subsequently, sidewall spacers are formed on the sidewalls of vertical projections by an oxidation process that reduces the thickness of vertical projections. Then, these sidewalls are used as a mask to etch through the floating gate layer, thus forming separate floating gate portions. Sidewall spacers are also used as a mask for etching into the underlying substrate to form STI trenches. Silicon Dioxide is added to fill the trenches. Masking portions and sidewall spacers are removed and a dielectric layer and a control gate layer are deposited. The control gate layer, dielectric layer and floating gate portions are then etched together to form word lines that are self aligned to floating gates.

DETAILED DESCRIPTION OF EXEMPLARY EMBODIMENTS

Memory Operation

Figure 1:
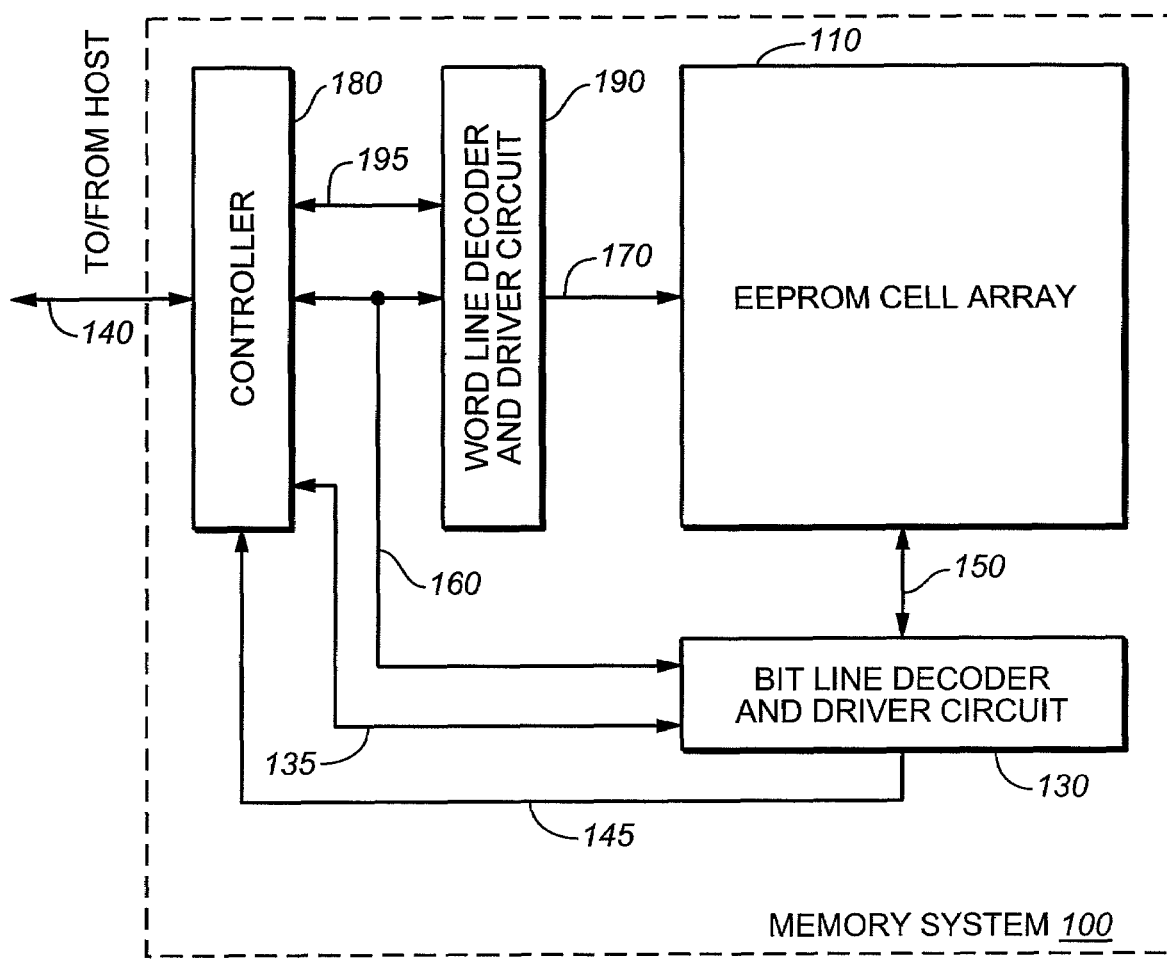
FIG. 1 shows a nonvolatile memory system including a controller and an array of memory cells in which various embodiments of the present invention may be utilized.

An example of a memory system 100 incorporating the various aspects of the present invention is generally illustrated in the block diagram of FIG. 1. A large number of individually addressable memory cells are arranged in a regular array 110 of rows and columns, although other physical arrangements of cells are certainly possible. Bit lines, designated herein to extend along columns of the array 110 of cells, are electrically connected with a bit line decoder and driver circuit 130 through lines 150. Word lines, which are designated in this description to extend along rows of the array 110 of cells, are electrically connected through lines 170 to a word line decoder and driver circuit 190. Each of the decoders 130 and 190 receives memory cell addresses over a bus 160 from a memory controller 180. The decoder and driving circuits are also connected to the controller 180 over respective control and status signal lines 135 and 195.

The controller 180 is connectable through lines 140 to a host device (not shown). The host may be a personal computer, notebook computer, digital camera, audio player, various other hand held electronic devices, and the like. The memory system 100 of FIG. 1 will commonly be implemented in a removable card according to one of several existing physical and electrical standards, such as one from the PCMCIA, the CompactFlash™ Association, the MMC™ Association, and others. Other removable formats include USB flash drives such as Cruzer® flash drives. When in a removable format, the lines 140 terminate in a connector that interfaces with a complementary connector of the host device. The electrical interface of many removable memory systems follows the ATA standard, wherein the memory system appears to the host as if it was a magnetic disk drive. Other memory card interface standards also exist. As an alternative to the card format, a memory system of the type shown in FIG. 1 may be permanently embedded in the host device.

The decoder and driver circuits 130 and 190 generate appropriate voltages in their respective lines of the array 110, as addressed over the bus 160, according to control signals in respective control and status lines 135 and 195, to execute programming, reading and erasing functions. Any status signals, including voltage levels and other array parameters, are provided by the array 110 to the controller 180 over the same control and status lines 135 and 195. A plurality of sense amplifiers within the circuit 130 receive current or voltage levels that are indicative of the states of addressed memory cells within the array 110, and provides the controller 180 with information about those states over lines 145 during a read operation. A large number of sense amplifiers are usually used in order to be able to read the states of a large number of memory cells in parallel. During reading and program operations, one row of cells is typically addressed at a time through the circuits 190 for accessing a number of cells in the addressed row that are selected by the circuit 130. During an erase operation, all cells in each of many rows are typically addressed together as a block for simultaneous erasure.

Figure 2A:
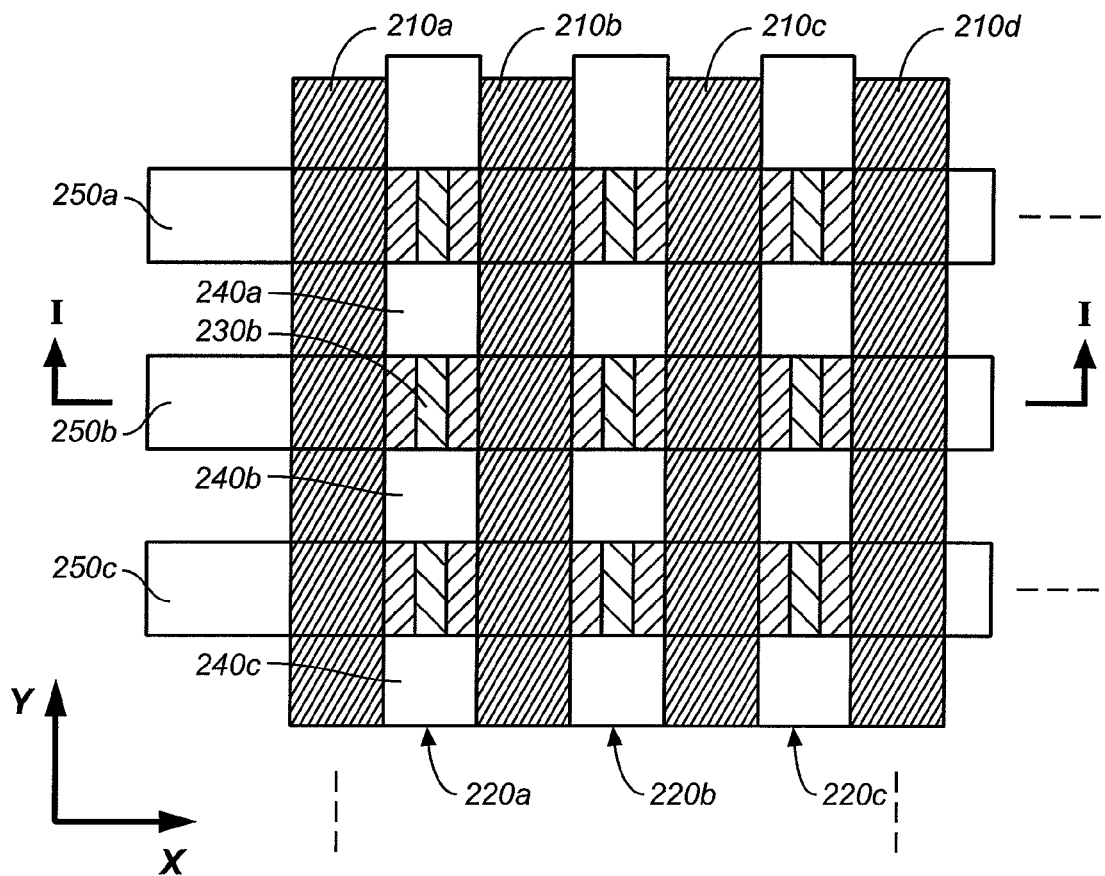
FIG. 2A shows a top-down view of a NAND flash memory array according to an embodiment of the present invention.

A plan view of an example of a NAND memory cell array 110 formed on a silicon substrate is shown in FIG. 2(A), wherein a small part of its repetitive structure of conductive elements is illustrated with little detail of dielectric layers that exist between the elements, for clarity of explanation. Shallow Trench Isolation (STI) structures 210a-d are formed extending through the surface of the substrate. In order to provide a convention for this description, the STI structures are shown to be spaced apart in a first x-direction, with lengths extending in a second y-direction, these first and second directions being essentially orthogonal with each other.

Between STI structures 210a-d, there are strings 220a-c of memory cells running in the y-direction. Thus, the direction of the strings is parallel to the direction of the STI structures. Each of strings 220a-c includes many memory devices connected in series. FIG. 2(A) shows portions of three strings 220a-c with three memory cells shown for each string. However, strings 220a-c may contain additional cells that are not shown in FIG. 2(A). Also, the array 110 contains additional strings that are not represented in FIG. 2(A). This type of array may have thousands of strings with 16, 32 or more cells in each string.

An exemplary memory cell includes a floating gate 230 and conductive source/drain regions 240a-b in the substrate adjacent to floating gate 230, on either side in the y-direction. Strings are separated by STI structures 210a-d. STI structures 210a-d form isolating elements that electrically isolate source/drain regions from source/drain regions of cells in adjacent strings. Along the y-direction source/drain regions are shared by adjacent cells. The source/drain regions electrically connect one cell to the next cell thus forming a string of cells. The source/drain regions 240a-c in this example are formed by implanting impurities into the substrate in the required areas.

Figure 2B:
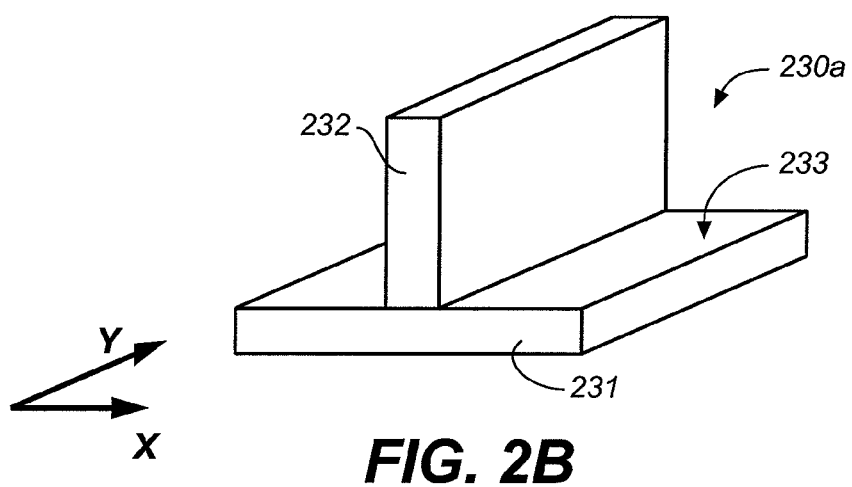
FIG. 2B shows an individual floating gate of the NAND flash memory array of FIG. 2A having an inverted-T shape in cross section.

Floating gates shown in the embodiment of FIG. 2(A) comprise two portions that can be better seen in the three dimensional view of floating gate 230a shown in FIG. 2(B). A lower floating gate portion 231 extends across the surface of the substrate on a thin silicon dioxide (oxide) layer. An upper floating gate portion 232 projects upward from upper surface 233 of lower floating gate portion 231 to form an inverted-T shape in cross section along the X-direction. Upper floating gate portion 232 extends to the edges of lower floating gate portion 231 in the y-direction but is narrower in the x-direction. Thus, the floating gate is wider below an intermediate level than it is above the intermediate level, leaving some of upper surface 233 of lower floating gate portion 231 exposed.

Lower and upper floating gate portions 231, 232 of this embodiment are both made of doped polysilicon. Polysilicon may be deposited in an undoped form and later implanted to form doped polysilicon or may be deposited in doped form. In one embodiment, lower floating gate portion 231 is deposited as undoped polysilicon and upper floating gate portion 232 is deposited as doped polysilicon. Later, after being subject to elevated temperatures for some period during processing, dopant from upper floating gate portion 232 diffuses into lower floating gate portion 231 so that it too becomes doped and conductive. Other suitable electrically conductive materials may also be used in place of doped polysilicon. Lower floating gate portion 231 and upper floating gate portion 232 may also be deposited in a single layer instead of two separate layers.

Word lines 250a-c are shown extending across the array in the x-direction in FIG. 2(A). Word lines 250a-c overlie portions of floating gate 230a and also partially surround floating gate 230a. In the embodiment shown, word line 250b overlies the exposed parts of upper surface 233 of lower floating gate portion 231 and encloses the upper surface and the sides of upper floating gate portion 232. Upper floating gate portion 232 adds to the surface area of the floating gate that couples floating gate 230a and the control gate 250b. This increased area provides an improved coupling ratio compared to a conventional floating gate.

Not shown in FIG. 2(A) are metal conductor layers. Since polysilicon elements such as word lines usually have a conductivity that is significantly less than that of metal, metal conductors are included in separate layers with connections made to respective metal lines through any intermediate layers at periodical intervals along the lengths of the polysilicon elements. Also, the word line may include a metal or metal-silicide portion to increase the electrical conductivity of the word line. For example, a refractory metal such as Cobalt or Tungsten may be used to form a silicide layer on top of the polysilicon layer. The silicide material has a higher conductivity than the polysilicon and thus improves electrical conduction along the word line.

Process for Forming Inverted-T Floating Gate

Figure 3:
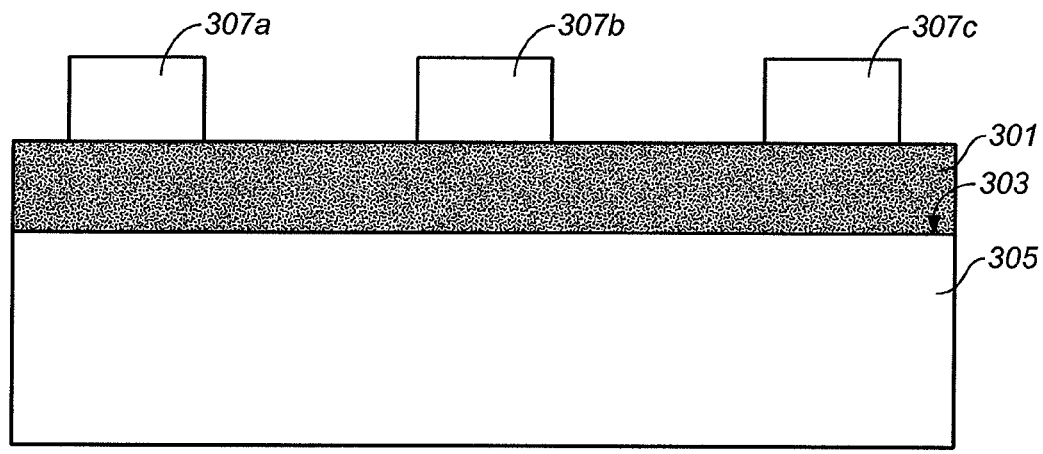
FIG. 3 shows a cross section of the NAND flash memory array of FIG. 2A at an early stage of fabrication with slimmed photoresist portions overlying a masking layer that overlies a substrate.

FIG. 3 shows a cross sectional view of the NAND memory array 110 of FIG. 2(A), along the X-direction (word line direction) indicated by I-I in FIG. 2(A), at an early stage of fabrication. A layer 301 of Silicon Nitride (SiN) or other masking material extends over an upper surface 303 of a substrate 305. Masking layer 301 may be deposited to cover the entire upper surface 303 and is therefore considered a blanket layer. Photoresist portions 307a-c are formed over masking layer 301. Photoresist is generally spun on at high speed to form a blanket layer that is then patterned by exposing the photoresist to light (or in some cases an electron beam), according to a predetermined pattern, in a lithographic process. This pattern determines which portions are removed and which remain when the photoresist is developed. Photoresist portions 307a-c extend in the y-direction (perpendicular to the cross section of FIG. 3) and overlie masking layer 301. Photoresist portions 307a-c may be formed to be very small and very closely spaced given the limits of the lithographic process used. In one example, the width of a photoresist portion is equal to the minimum feature size F when it is deposited, and the distance between adjacent photoresist portions is F when they are deposited. However, in the present embodiment, photoresist portions 307a-c are subject to a slimming process that removes some photoresist, leaving photoresist portions 307a-c having a width that is less than the minimum feature size. Examples of resist slimming processes are described in U.S. Pat. No. 6,888,755 and U.S. patent application Ser. No. 11/316,654. Subsequently, photoresist portions 307a-c are used to pattern masking layer 301 into masking portions in the same pattern as photoresist portions 307a-c. Then, masking portions are used as an etch mask for forming trenches for isolation.

Figure 4:
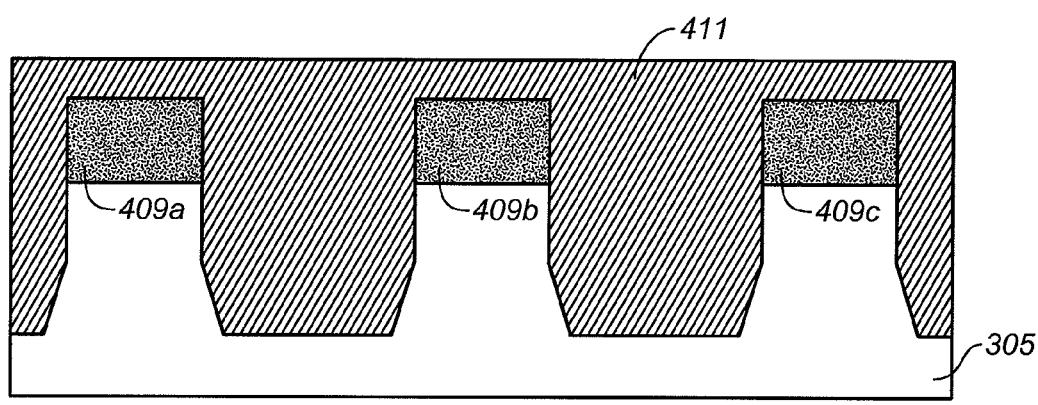
FIG. 4 shows the structure of FIG. 3 after patterning the masking layer into masking portions that are then used to locate STI trenches that are filled with Silicon Dioxide.
Figure 5:
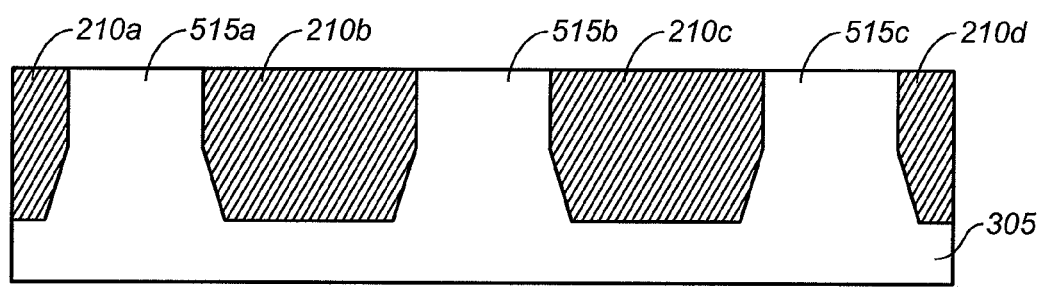
FIG. 5 shows the structure of FIG. 4 after planarization to remove masking portions and excess Silicon Dioxide.

FIG. 4 shows masking portions 409a-c patterned using photoresist portions 307a-c and the trenches that are formed using masking portions 409a-c as an etch mask. Once masking layer 301 is patterned to form separate masking portions 409a-c, photoresist portions 307a-c may be removed. Then, an anisotropic etch is performed with masking portions 409a-c in place. The result is the formation of trenches into substrate 305 between areas of substrate 305 that are covered by masking portions 409a-c. These trenches are then filled with Silicon Dioxide ($SiO_2$ or "oxide") 411. Subsequently, masking portions 409a-c and excess Silicon Dioxide 411 may be removed (e.g. by CMP or using an etch-back process) to leave a planarized surface as shown in FIG. 5. The Silicon Dioxide filled trenches form Shallow Trench Isolation (STI)

structures 210a-d. STI structures 210a-d provide isolation between adjacent memory cells. STI structures 210a-d extend in the Y-direction. Between adjacent STI structures 210a-d are remaining substrate portions 515a-c where memory cells are later formed. Unlike some prior structures, STI structures 210a-d of FIG. 5 are wider than remaining substrate portions 515a-c between them, and remaining substrate portions 515a-c are narrower than the minimum features size of the lithographic process used.

Figure 6:
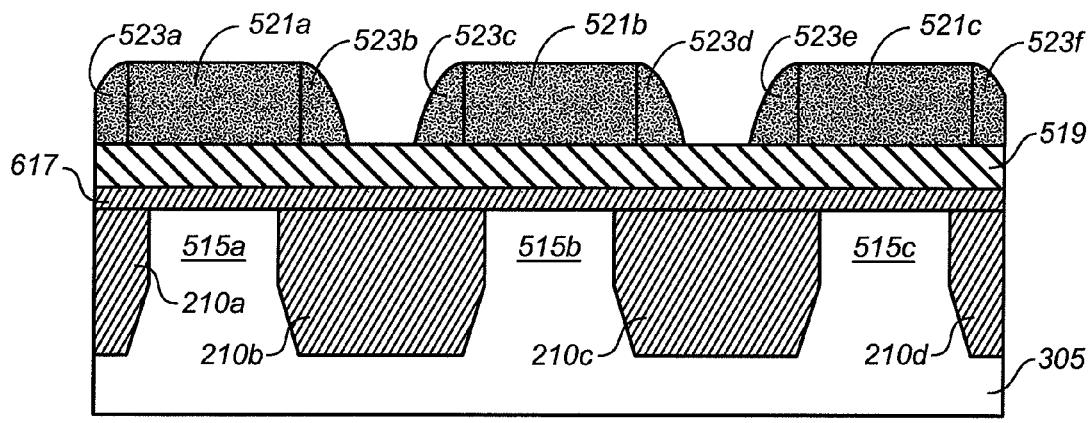
FIG. 6 shows the structure of FIG. 5 after formation of a gate dielectric layer, a first floating gate layer, masking portions and sidewall spacers on exposed sidewalls of masking portions.

Subsequent to the planarizing step, a gate dielectric layer 617 (in this example, Silicon Dioxide) is formed across substrate 305 (e.g. by thermal oxidation or deposition) and a first conductive layer 519 of conductive material (in this example, polysilicon) is deposited over gate dielectric layer 617 as shown in FIG. 6. A masking layer is deposited over first conductive layer 519 and is patterned into masking portions 521a-c that are located over remaining substrate portions 515a-c. Masking portions 521a-c are Silicon Nitride in this example and are patterned using photoresist, though in this case without resist slimming. In order to locate masking portions 521a-c over remaining substrate portions 515a-c, the pattern forming masking portions 521a-c is aligned to the existing pattern of STI structures 210a-c and remaining portions 515a-c. After masking portions 521a-c are formed, sidewall spacers 523a-f are formed along their sides. Such sidewall spacer formation is well known and may be achieved by depositing a layer of dielectric and then performing an anisotropic etch. Prior to forming sidewall spacers 523a-f, the gap between masking portions 521a-c is the minimum feature size (F). Sidewall spacers 523a-f reduce this gap so it is less than the minimum feature size. Masking portions 521a-c with sidewall spacers 523a-f are then used as an etch mask to etch through the first conductive layer 519. The portions of first conductive layer 519 that are removed by this etch are then replaced by a suitable dielectric (in this example, Silicon Dioxide).

Figure 7:
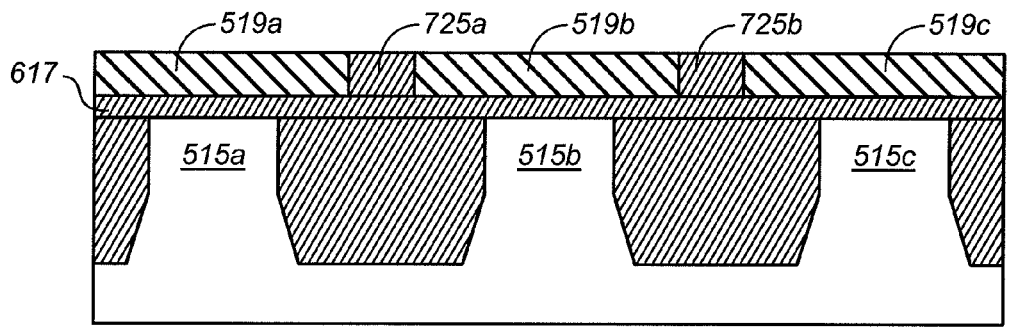
FIG. 7 shows the structure of FIG. 6 after dividing the first floating gate layer into first floating gate portions with dielectric between them and removal of masking portions and sidewall spacers.

FIG. 7 shows the structure of FIG. 6 after first conductive layer 519 is separated into first conductive portions 519a-c that extend in the y-direction (perpendicular to the cross section of FIG. 7) and masking portions 521a-c and sidewall spacers 523a-f are removed providing a planarized surface. Removal of masking portions 521a-c and sidewall spacers 523a-f may also remove any excess dielectric so that only dielectric portions 725a-b lying between first floating gate portions 519a-c remain. First conductive portions 519a-c are electrically isolated from each other by dielectric portions 725a-b and are isolated from underlying remaining substrate portions 515a-c by gate dielectric layer 617. Subsequently, another masking layer is formed and patterned.

Figure 8:
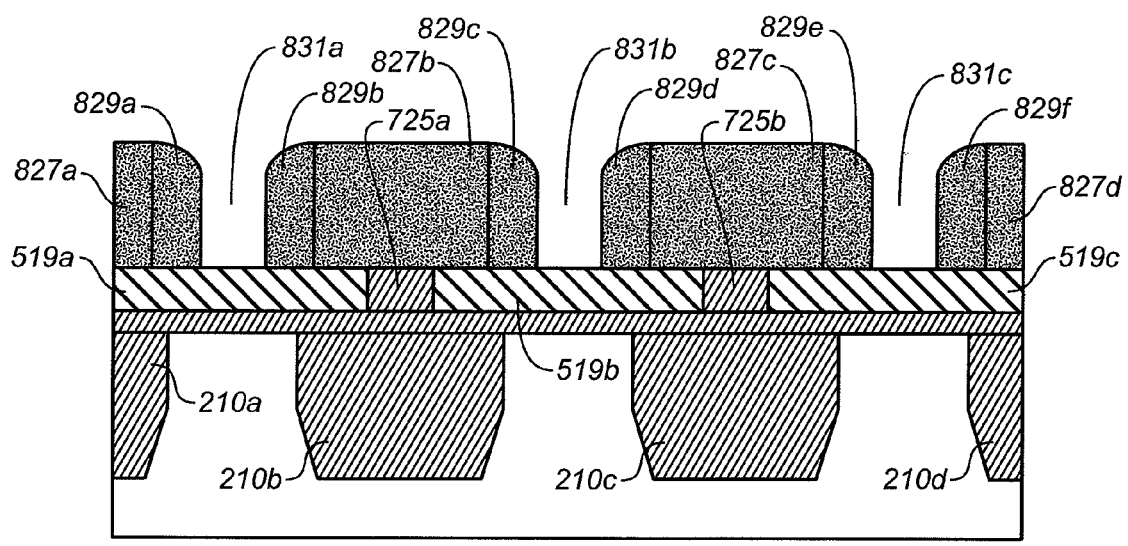
FIG. 8 shows the structure of FIG. 7 after formation of masking portions and sidewall spacers to form slots over floating gate portions.

FIG. 8 shows the structure of FIG. 7 with second masking portions 827a-d (of Silicon Nitride) and sidewall spacers 829a-f (of Silicon Dioxide) formed over first conductive portions 519a-c and dielectric portions 725a-c. Masking portions 827a-d and sidewall spacers 829a-f may be formed as before so that the gaps between sidewall spacers 829a-f are less than the minimum feature size and these gaps form slots 831a-c that extend upwards from first conductive portions 519a-c. Forming masking portions 827a-d involves aligning the pattern used to form masking portions 827a-d to preexisting structures. In this case, masking portions 827a-d are located over STI structures 210a-d so that slots 831a-c between sidewall spacers are centered over first conductive portions 519a-c. Subsequently, a second floating gate layer is deposited to fill slots 831a-c.

Figure 9:
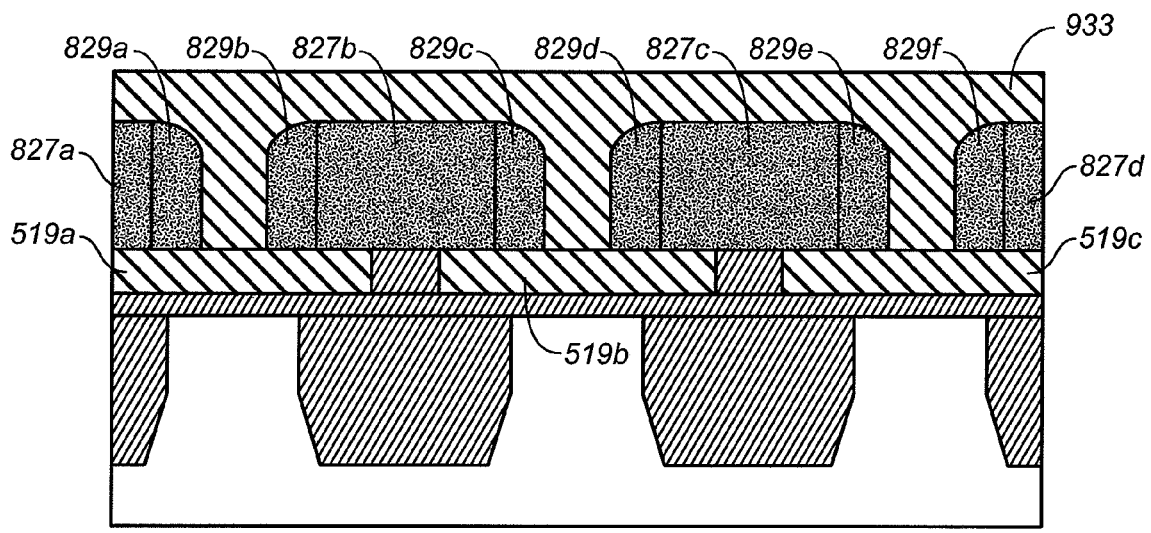
FIG. 9 shows the structure of FIG. 8 after deposition of a second floating gate layer that fills slots over first floating gate portions.

FIG. 9 shows the result of depositing a second conductive layer 933 to fill slots 831a-c. The material of second conductive layer 933 is doped polysilicon in this example. Second conductive layer 933 is in contact with first conductive portions 519a-c at the bottom of slots 831a-c and forms electrical contact at these points. After second conductive layer 933 is deposited, an etch (or series of different etches) may be performed to remove excess material of second conductive layer 933 and to remove masking portions 827a-d and sidewall spacers 829a-f.

Figure 10:
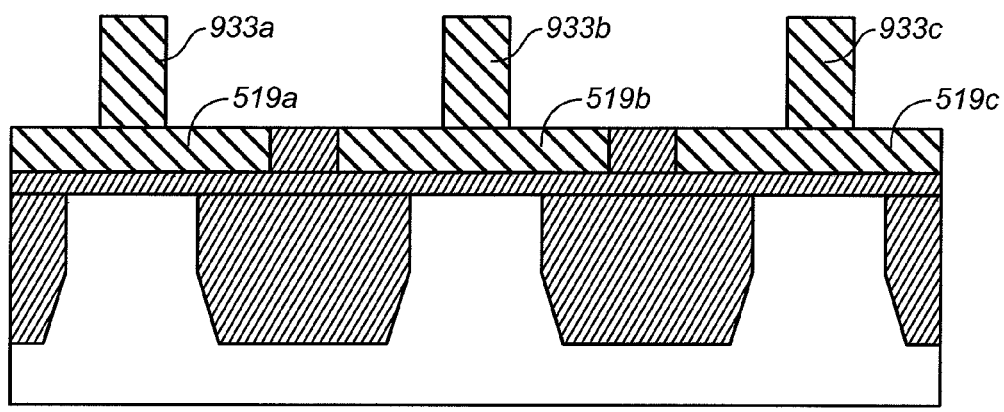
FIG. 10 shows the structure of FIG. 9 after removal of excess second floating gate material, masking portions and sidewall spacers.

FIG. 10 shows the result of the removal of excess material of second conductive layer 933, masking portions 827a-d and sidewall spacers 829a-f. Second conductive portions 933a-c remain that extend upwards from first conductive portions 519a-c to form an inverted-T shape in the cross section shown in FIG. 10. Second conductive portions 933a-c remain where slots 813a-c were formed and their dimensions are determined by slots 813a-c and may be less than the minimum feature size. Subsequently, a second dielectric layer is deposited over the first and second conductive portions and a control gate layer is deposited over the second dielectric layer.

Figure 11:
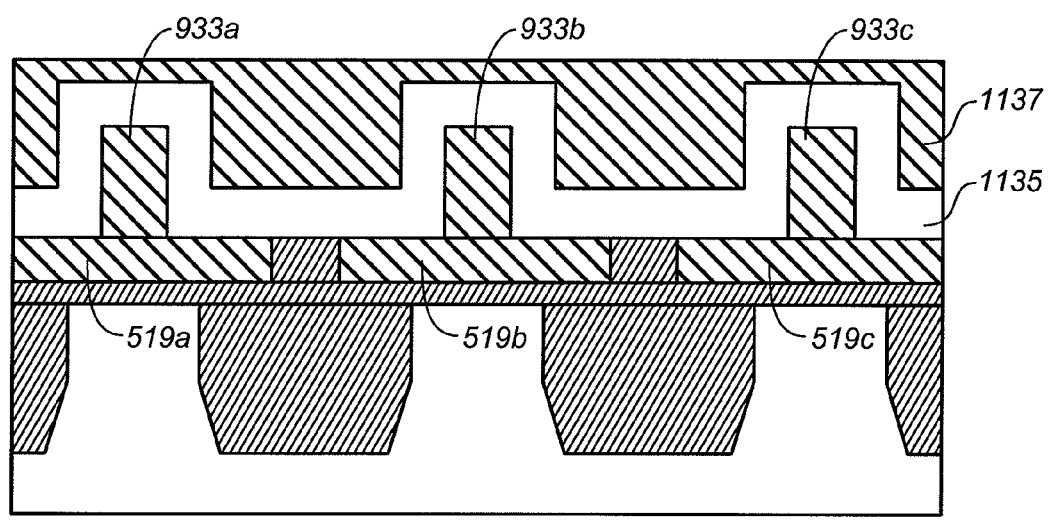
FIG. 11 shows the structure of FIG. 10 after formation of a dielectric layer and control gate layer over floating gate portions.

FIG. 11 shows the structure of FIG. 10 with a second dielectric layer 1135 overlying first conductive portions 519a-c and second conductive portions 933a-c and with a control gate layer 1137 overlying second dielectric layer 1135. The material of control gate layer 1137 is doped polysilicon in the present example. An additional layer of Tungsten Silicide, Cobalt Silicide or other conductive material may also be added over the polysilicon to provide a control gate layer with lower sheet resistance. Second dielectric layer 1135 may be referred to as Inter Poly Dielectric (IPD), though in some cases, material other than polysilicon may be used for conductive portions or control gate material, or for both conductive portion material and control gate material. In the example of FIG. 11 second dielectric layer 1135 is a compound layer made up of a layer of Silicon Dioxide (oxide), then a layer of Silicon Nitride (nitride), then another layer of Silicon Dioxide (oxide). This oxide-nitride-oxide (ONO) stack may provide better performance than a single dielectric material. Subsequent to forming control gate layer 1137, a patterning step may be performed to separate control gate layer 1137 into word lines 250a-c and, in the same step, separate first and second conductive portions into separate floating gates. In this way, floating gates and word lines are self-aligned.

Figure 12:
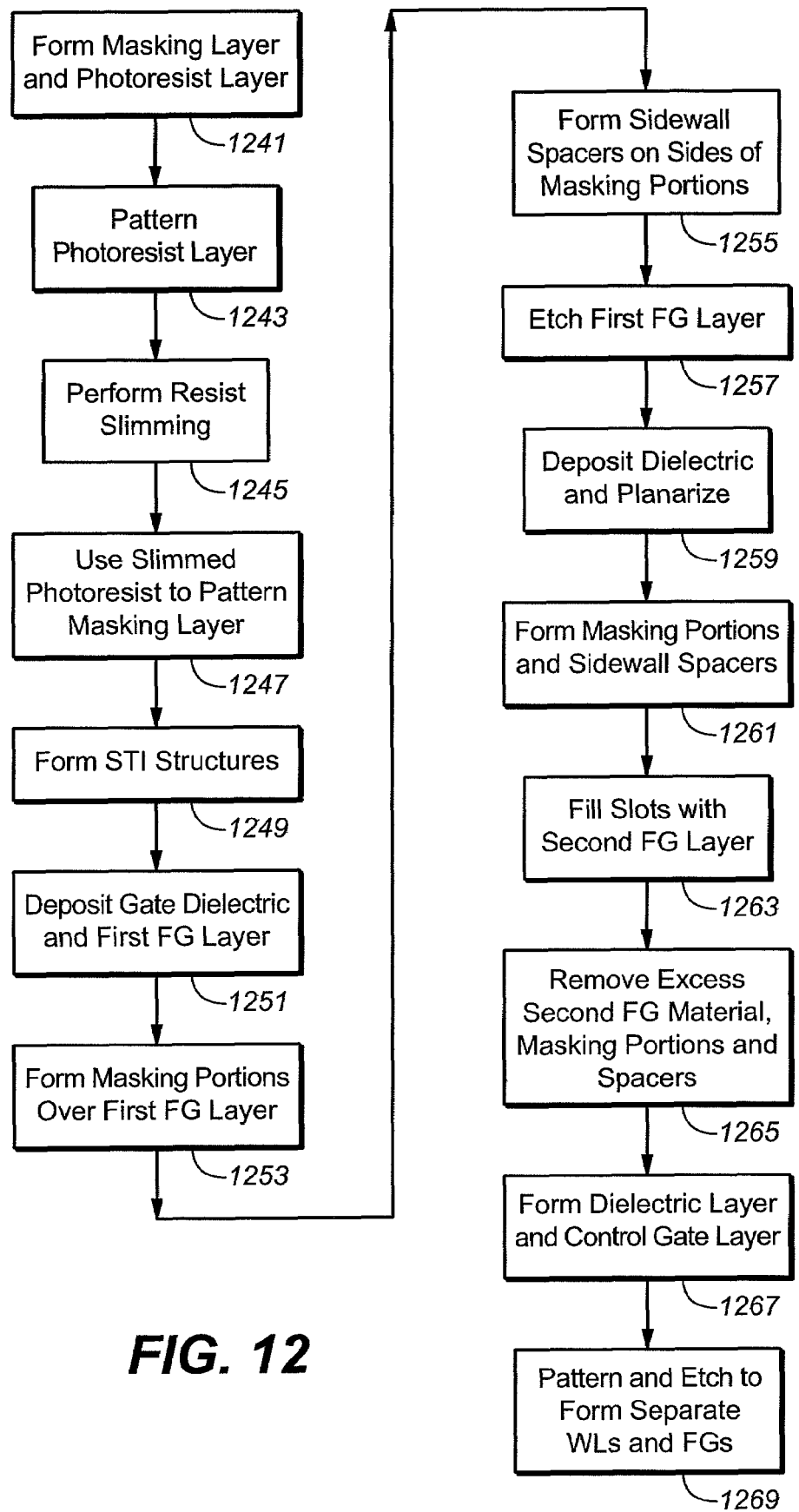
FIG. 12 shows a flowchart of the process of FIGS. 3-11.

FIG. 12 shows a flowchart that summarizes the process of FIGS. 3-11. First, a masking layer is formed on a substrate and a photoresist layer is formed over it 1241. The photoresist layer is patterned 1243 and the pattern is then subjected to resist slimming 1245. The slimmed photoresist portions are then used to pattern the masking layer into masking portions 1247. Masking portions form a mask layer that is used to establish the locations of trenches. The trenches are filled with Silicon Dioxide and planarization is performed to form STI structures 1249. A gate dielectric layer and a first floating gate layer are then deposited 1251. Masking portions are formed over the first floating gate layer 1253 and sidewall spacers are formed on the sides of the masking portions 1255. Then, the masking portions and sidewall spacers are used as a mask to etch the first floating gate layer 1257 and thus form separated first floating gate portions. Dielectric is deposited to fill the gaps between first floating gate portions and then planarization is performed 1259 to remove excess dielectric, masking portions and sidewall spacers. Another set of masking portions and sidewall spacers are formed 1261 over the first floating gate portions. The masking portions and sidewall spacers are located so that slots formed between sidewall spacers overlie first floating gate portions. The slots are filled with a second floating gate layer 1263 and then excess second floating gate material is removed along with masking portions and sidewall spacers 1265 leaving second floating gate portions. This leaves surfaces of first and second floating gate portions exposed. Subsequently a dielectric layer is deposited over the first and second floating gate portions and a control gate layer is deposited over the dielectric layer 1267. An etch step etches the stack formed by prior processing so that the control gate layer is divided into separate word lines and the first and second floating gate portions are divided into separate floating gates 1269. Thus, floating gates are self-aligned to word lines.

Figure 13:
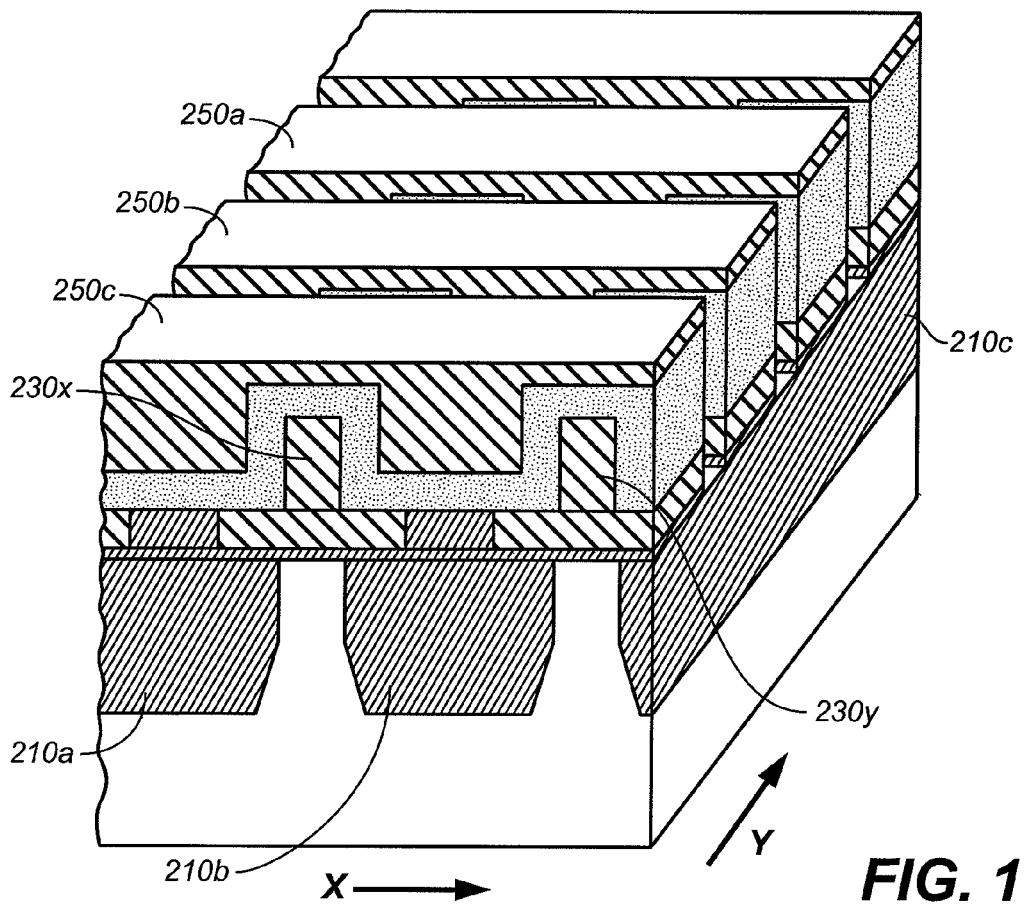
FIG. 13 shows a cut-away view of the structure of FIG. 11 including separate word lines extending over floating gates with control gates and floating gates self-aligned.

FIG. 13 shows the structure of FIG. 2A in three dimensions. Word lines 250*a-d* extend in the x-direction and are spaced apart in the Y-direction. Word lines 250*a-d* form control gates where they overlie and are coupled to individual floating gates. STI structures 210*a-c* extend in the Y-direction and are spaced apart in the X-direction. Word lines 250*a-c* may be used as an implant mask to implant source/drain regions between memory cells in the Y-direction. Such implantation connects memory cells into strings that extend in the Y-direction between STI structures 210*a-c*. Individual floating gates consist of a lower portion and an upper portion as shown in FIG. 2B.

One advantage of the structure of FIG. 13 is that there is less capacitive coupling between adjacent floating gates along the Y-direction. Some prior structures use a floating gate that is rectangular in cross section along the X-direction, with the lateral dimension determined by the minimum feature size of the lithographic process used. In contrast, the embodiment of FIG. 13 has floating gates with an upper portion that is narrower than the minimum feature size. This means that area of the exposed facets of the floating gates of FIG. 13 may be reduced, thereby reducing the capacitive coupling between adjacent floating gates. Reducing the facet area in this way may be done without reducing coupling between the control gate and floating gate. The coupling between control gate and floating gate depends on the total area of the control gate that overlies a surface of the floating gate. This is unaffected by making an upper portion of the floating gate narrower in the X-direction. In addition, in the embodiment of FIG. 13, fringing fields between a floating gate and the control gate coupled to it may be increased relative to electric fields between the floating gate and its neighbor in the Y-direction. This is because the distance between the control gate and the center of a facet of the floating gate is reduced compared with the distance between the facet and a facet of an adjacent floating gate in the Y-direction. This tends to improve coupling between the floating gate and the control gate compared with the coupling between the floating gate and its neighbor in the Y-direction.

Figure 14:
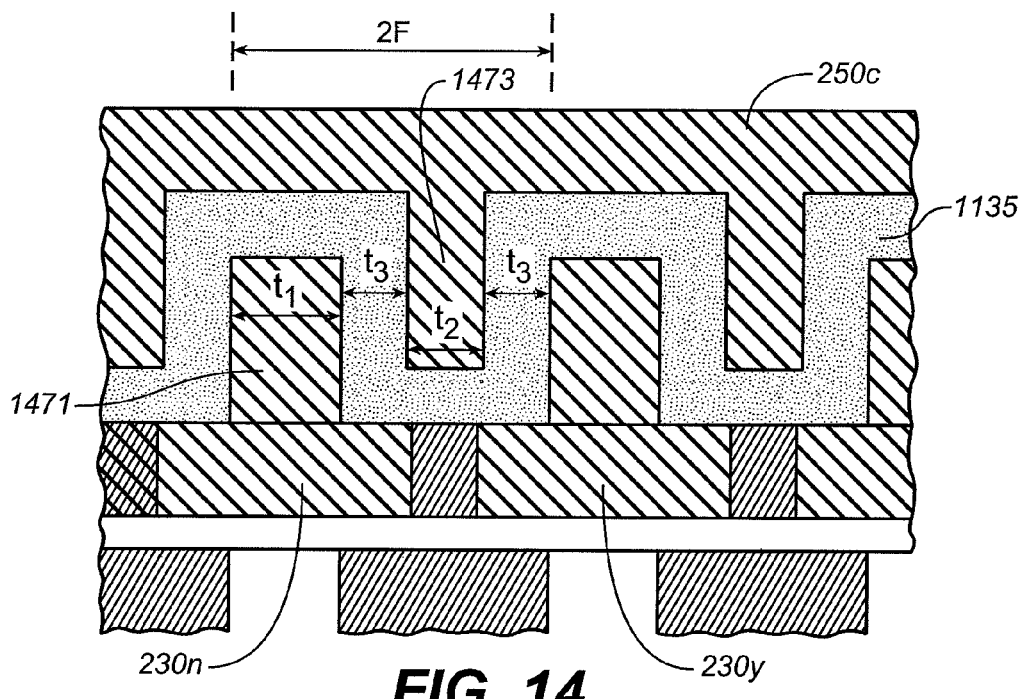
FIG. 14 shows certain dimensions of the structures of FIG. 13.

An advantage of the structure of FIG. 13 is that it may be scaled to small dimensions more easily than some other structures. In particular, because the upper portions of floating gates are relatively narrow, this leaves more space between floating gates at this level, so that there is more room for the control gate and dielectric layer. Given certain limitations in how small the control gate and dielectric layer can be made, this may allow memory cells to be made smaller than they would be if the upper portion was larger. FIG. 14 illustrates this concept. A cross section along a word line 250*c* (i.e. along the X-direction) is shown with certain dimensions indicated. The distance between a point on a floating gate 230x and a corresponding point on a neighboring floating gate 230y along the X-direction is twice the minimum feature size (2F). In FIG. 14, the distance 2F is shown extending from the side of an upper portion of floating gate 230x to the side of an upper portion of adjacent floating gate 230y in the X-direction. Within the distance 2F there is an upper floating gate portion 1471 having a thickness $t_1$ and a portion 1473 of word line 250*c* having a thickness $t_2$ and between them dielectric layer 1135 having a thickness $t_3$. Thus, in this example, $2F=t_1+t_2+2t_3$. The dimensions, $t_1$, $t_2$ and $t_3$ may have certain minimum values for any given materials in order to avoid high failure rates. Typically, where an upper floating gate portion is formed of polysilicon, $t_1$ will not be made less than 100 Angstroms. Similarly, if a word line is formed of polysilicon, $t_2$ will not be made less than 100 Angstroms. Where the dielectric is an ONO layer, t3 will typically not be made less than 120 Angstroms. So using these minimum values, 2F=440 Angstroms and F=220 Angstroms (22 nanometers). Thus, for certain materials, adequate performance may be maintained in the structure shown with minimum feature sizes as small as 22 nanometers. In contrast, if $t_1$=F (upper portion has dimension equal to minimum feature size), then $t_2+2t_3°$ F., and substituting the minimum values, F=340 Angstroms (34 nanometers). While these examples relate to particular materials and their limits, where other materials are used, other limits may apply.

Figure 15:
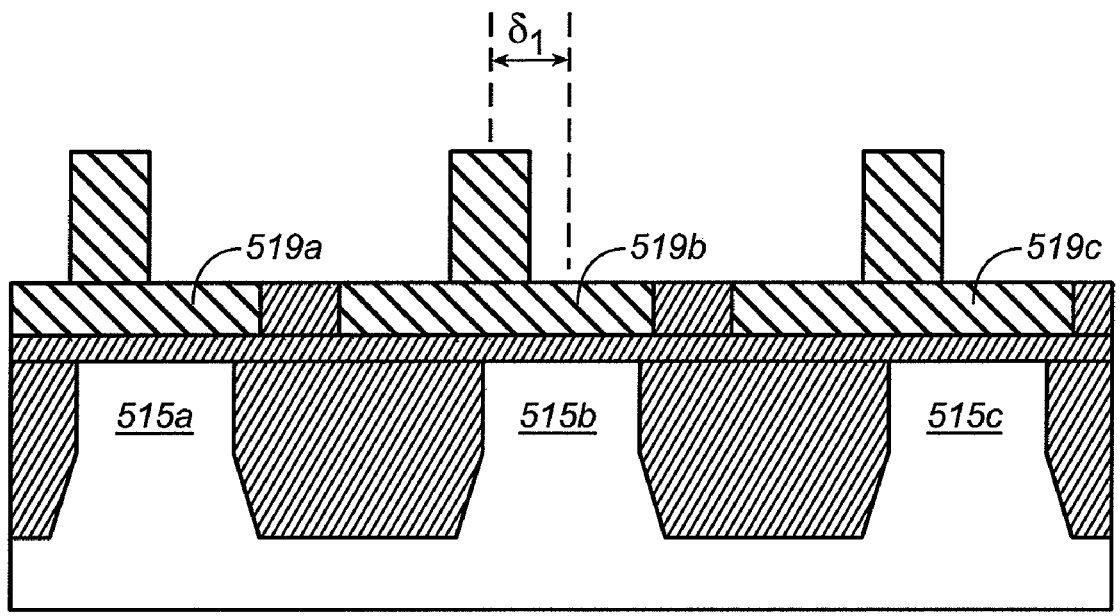
FIG. 15 shows misalignment between floating gates and channel regions in a memory array.

Another advantage of the embodiment of FIG. 13 is that it is relatively insensitive to misalignment that may occur between components. For example, if first floating gates 230*x-y* are misaligned with respect to STI structures 210*a-d* this may not greatly affect device performance. FIG. 15 shows misalignment of $\delta_1$ between first conductive portions 519*a-c* and channel regions that are formed from remaining substrate portions 515*a-c*. Because first conductive portions 519*a-c* are made wider than the minimum feature size and remaining portions 515*a-c* are made smaller than the minimum feature size, first conductive portions 519*a-c* still overlie the entire width of the channel regions and there is no great change in coupling between first conductive portions and channel regions in this case. In other embodiments, the channel region may be made smaller without making the first floating gate portions larger and this may provide enough margin for error in alignment. Similarly, providing wide first floating gate portions without making the channel smaller may be sufficient.

Figure 16:
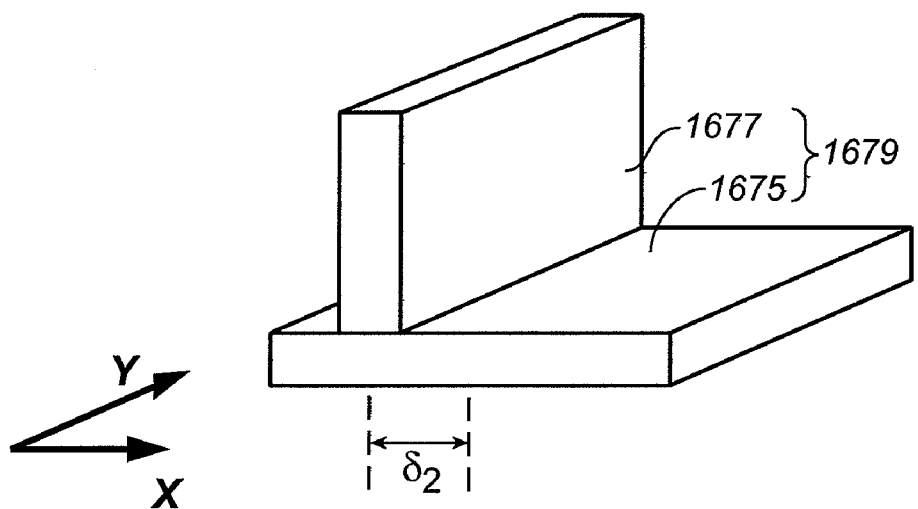
FIG. 16 shows misalignment between a lower floating gate portion and an upper floating gate portion of a floating gate.

FIG. 16 shows misalignment of $\delta_2$ between a lower floating gate portion 1675 and an upper floating gate portion 1677. In this case, the coupling between floating gate 1679 (formed of lower portion 1675 and upper portion 1677) and an overlying control gate remains the same because the area that couples floating gate 1679 to the control gate is not affected by moving the upper floating gate portion 1677 in the X-direction. Thus, the structure of FIG. 13 is relatively tolerant of misalignment.

Self-Aligned Process

An alternative process to that described above uses self-alignment to produce features that do not need a separate alignment step to establish their relative locations. By not requiring separate alignment steps, the overall process flow may be simplified and thus, costs may be reduced. In addition, failure due to misalignment may be reduced or eliminated.

Figure 17:
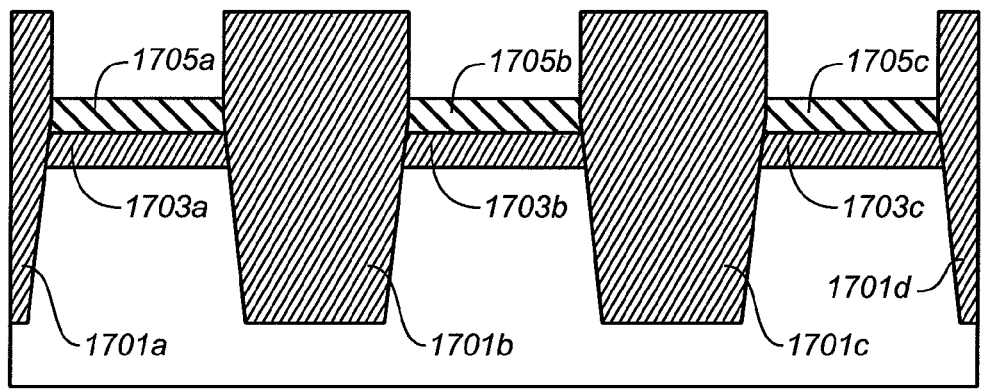
FIG. 17 shows a cross section of a NAND flash memory array at an early stage of fabrication, according to another embodiment of the present invention, with STI structures and first floating gate portions that are formed in a self-aligned manner.

FIG. 17 shows a cross section of a NAND memory array, along the X-direction, at an early stage of fabrication. STI structures 1701*a-d* extend in the Y-direction and are shown in cross section in FIG. 17. Between STI structures 1701*a-d*, gate dielectric portions 1703*a-d* and first conductive portions 1705*a-c* extend in the Y-direction. The structure shown in FIG. 17 is generally formed by depositing a blanket layer of gate dielectric (in this case Silicon Dioxide) followed by a blanket layer of conductive material. In the present example, the conductive material is polysilicon deposited to a thickness of 10 nanometers. Next, masking portions that extend in the Y-direction are formed over the floating gate layer. Trenches are formed according to the pattern of the masking portions. The trenches extend through the conductive layer, gate dielectric layer and into the underlying substrate. These trenches divide the conductive layer and the gate dielectric layer into first conductive portions 1705a-c and gate dielectric portions 1703a-c respectively. The trenches are filled with dielectric material, in this case Silicon Dioxide to form STI structures 1701a-d. Subsequently, masking portions are removed from over the first conductive portions 1705a-c to leave sidewalls of STI structures 1701a-d exposed. Subsequently, sidewall spacers are formed on STI sidewalls.

Figure 18:
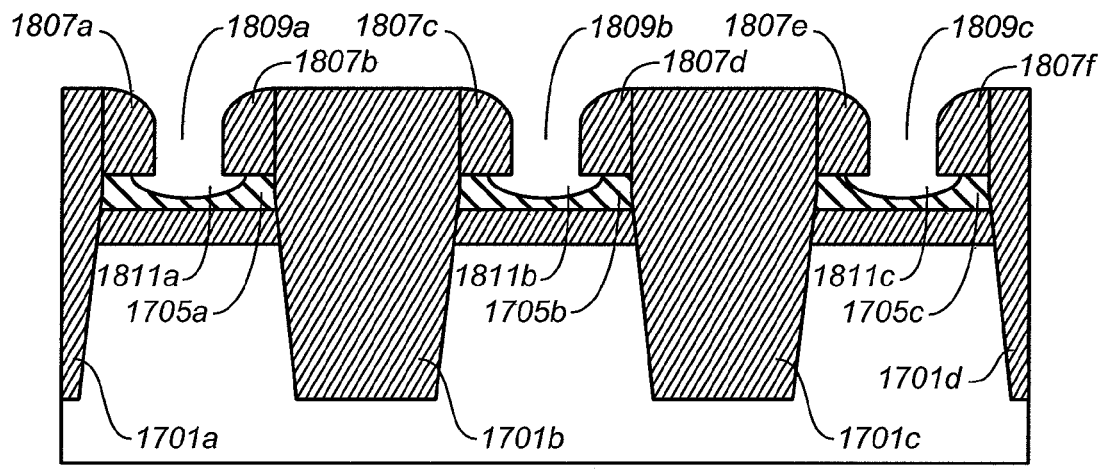
FIG. 18 shows the structure of FIG. 17 after formation of sidewall spacers on exposed sidewalls of STI structures so that slots are formed over first floating gate portions, cavities are also formed at the base of slots.

FIG. 18 shows the structure of FIG. 17 after formation of sidewall spacers 1807a-f along exposed sidewalls of STI structures 1701a-d. Sidewall spacers 1807a-f are formed by depositing a layer of Silicon Dioxide using a TEOS (Tetraethyl Orthosilicate) based process and then performing anisotropic etching. Sidewall spacers 1807a-f overlie first conductive portions 1705a-c. Slots 1809a-c are formed between sidewall spacers 1807a-f over first conductive portions 1705a-c so that first conductive portions 1705a-c are partially exposed. FIG. 18 shows some of first conductive portions 1705a-c removed under slots 1809a-c to form cavities 1811a-c at these locations. Cavities 1811a-c extend between sidewall spacers 1807a-f and first conductive portions 1705a-c. Cavities 1811a-c may be formed by performing an additional wet etch after the dielectric layer is etched to form slots 1809a-c. In some cases, no cavities are formed in first conductive portions, so no wet etch is needed. Subsequently, a second floating gate layer is deposited.

Figure 19:
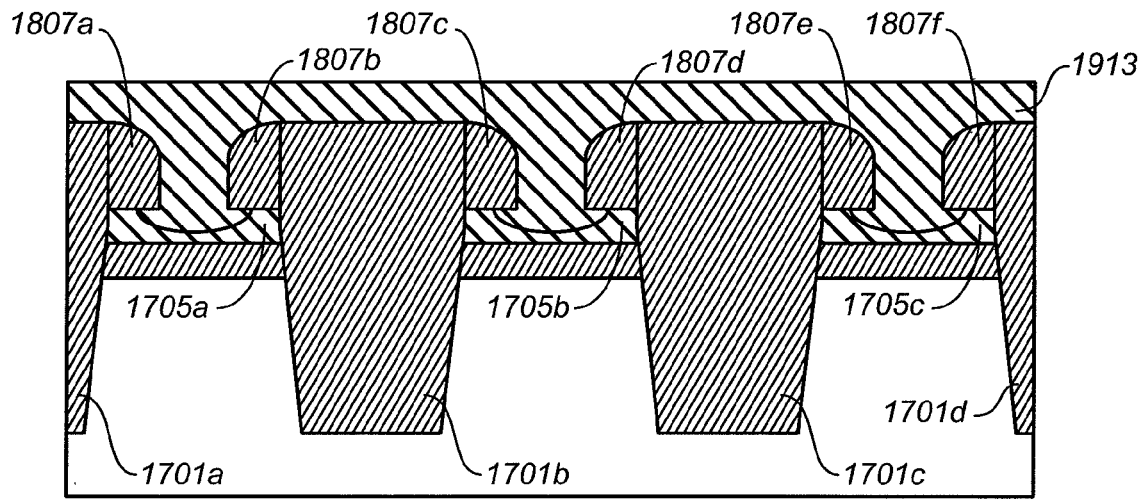
FIG. 19 shows the structure of FIG. 18 after deposition of a second floating gate layer that fills slots between sidewall spacers and fills cavities.

FIG. 19 shows second conductive layer 1913 (of doped polysilicon) deposited over the structure of FIG. 18. In particular, second conductive layer 1913 is deposited to fill cavities 1811a-c in first conductive portions 1705a-c and to fill slots 1809a-c that overlie first conductive portions 1705a-c. Second conductive layer 1913 also overlies STI structures 1701a-d and sidewall spacers 1807a-f. Forming cavities 1811a-c allows good adhesion between first conductive portions 1705a-c and second conductive layer 1913. In particular, when second conductive layer 1913 is deposited, it fills cavities 1811a-c and this provides a stable base for structures that are later formed. The increased interface area between the first conductive portions 1705a-c and second conductive layer 1913 improves the physical strength of the bond between these portions. This may be important to avoid damage during later processing. In particular, CMP or other processes could cause second floating gate portions to break-off if they were not adequately secured. In some other examples, such cavities may not be used because sufficient contact is achieved without them.

Figure 20:
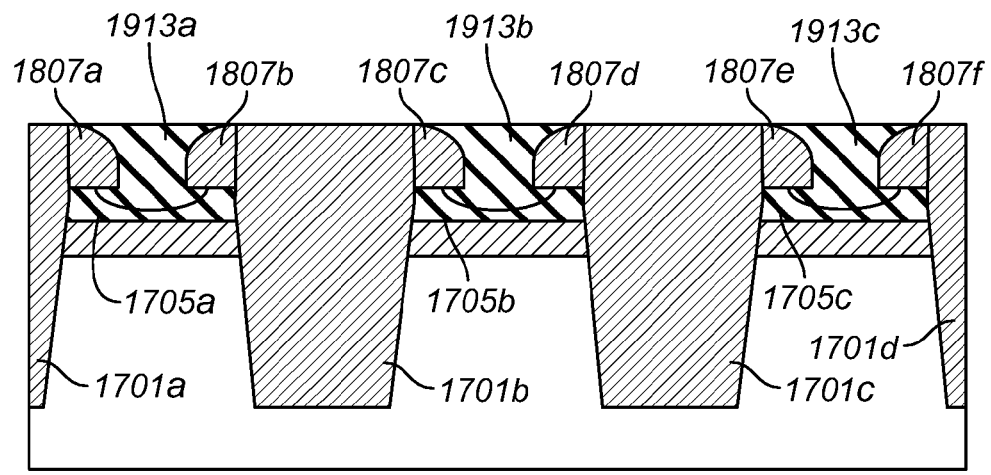
FIG. 20 shows the structure of FIG. 19 after planarization to remove excess second floating gate material.

FIG. 20 shows the structure of FIG. 19 after planarization to remove excess material of second conductive layer 1913. This leaves second conductive portions 1913a-c attached to first conductive portions 1705a-c. This may be achieved by Chemical Mechanical Polishing (CMP) or etch-back or other means. This planarization may remove some material from STI structures 1701a-d and sidewall spacers 1807a-f also. Subsequently, additional material is removed from STI structures 1701a-d and sidewall spacers 1807a-f.

Figure 21:
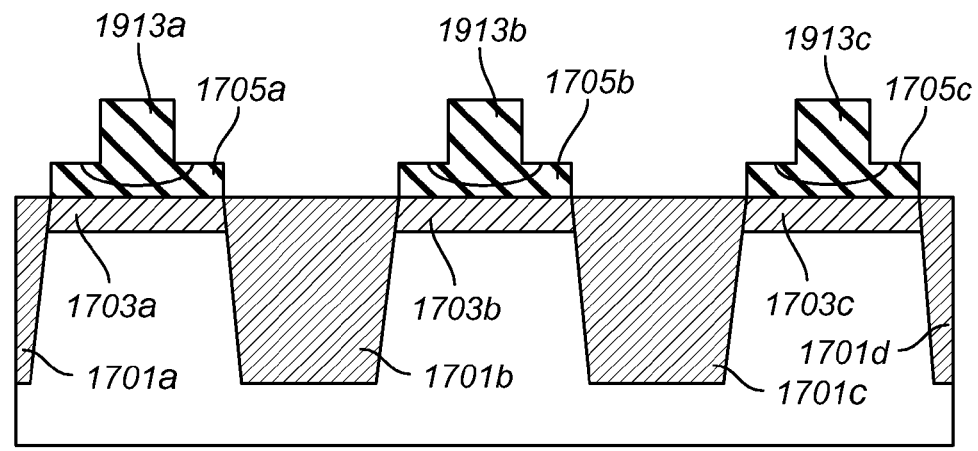
FIG. 21 shows the structure of FIG. 20 after removal of sidewall spacers and removal of portions of STI structures.

FIG. 21 shows the structure of FIG. 20 after removal of sidewall spacers 1807a-f and removal of portions of STI structures 1701a-d down to a level that is close to gate dielectric portions 1703a-c. In some cases, portions of STI structures are removed down to a level that is lower than shown. For example, STI structures may be etched below the level of the top of the gate dielectric portions 1703a-c. In other cases, STI material is removed down to a higher level than shown, such as the level of the top of first conductive portions 1705a-c. Subsequently, a dielectric layer and control gate layer are formed over conductive portions.

Figure 22:
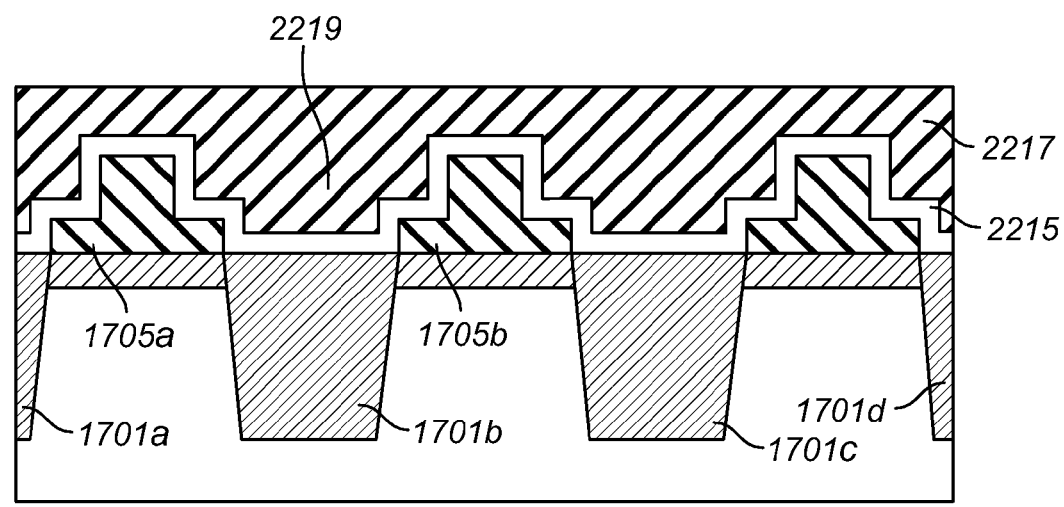
FIG. 22 shows the structure of FIG. 21 after deposition of a dielectric layer and deposition of a control gate layer over floating gates.

FIG. 22 shows the structure of FIG. 21 after deposition of a dielectric layer 2215 and a control gate later 2217. These layers may be deposited as previously described and subsequently etched according to a pattern to form word lines and separate floating gates in a self-aligned manner. Thus, a memory array is formed that is similar to that shown in FIG. 2A, with floating gates having an inverted-T shape as shown in FIG. 2B. In this example, a portion 2219 of control gate layer 2217 extends down between adjacent first conductive portions 1705a, 1705b and thus provides shielding between adjacent lower floating gate portions in the word line direction.

Figure 23:
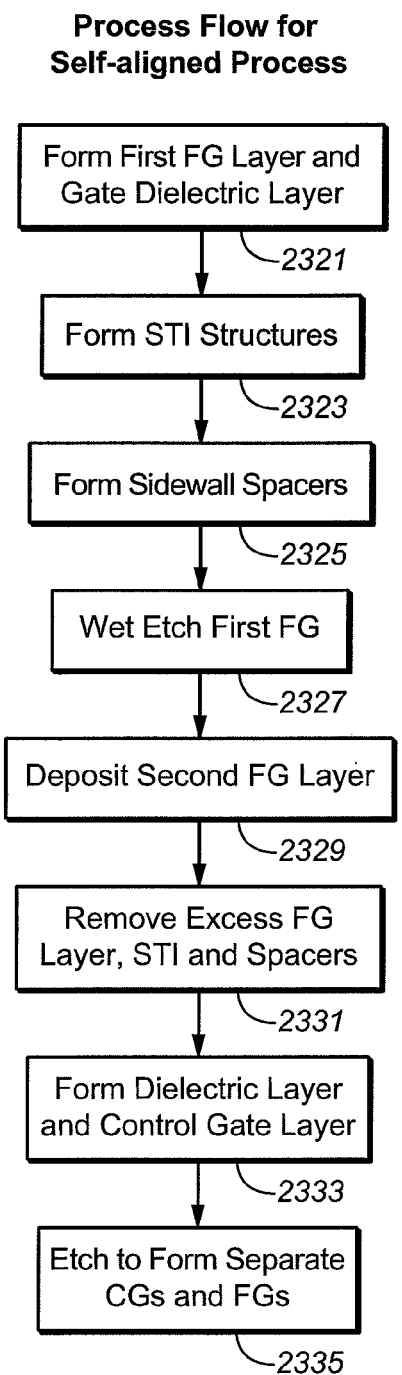
FIG. 23 shows a flowchart of the process described in FIGS. 17-22.

FIG. 23 shows a flowchart that summarizes the process of FIGS. 17-22. The first floating gate layer and gate dielectric layer are first formed as blanket layers 2321. Then, STI structures are formed 2323, thus separating the first floating gate layer into separate portions that later form individual floating gates. Sidewall spacers are formed 2325 on the exposed sides of STI structures overlying first floating gate portions so that slots remain over the first floating gate portions. A wet etch removes some of the exposed first floating gate material and some floating gate material under sidewall spacers 2327. A second floating gate layer is deposited to fill the slots and cavities 2329. Then, excess second floating gate material is removed along with the sidewall spacers and portions of STI structures 2331. Then, a dielectric layer and control gate layer are deposited over the floating gate portions STI structures 2333. A patterned etch is then performed to form separate word lines and floating gates that are self-aligned 2335.

Sidewall Oxidation Process

In an alternative embodiment, inverted-T shaped floating gates are formed by shaping a conductive layer by removal of conductive material and subsequently separating the conductive layer into separate conductive portions and forming STI trenches so that they are self-aligned to conductive portions.

Figure 24:
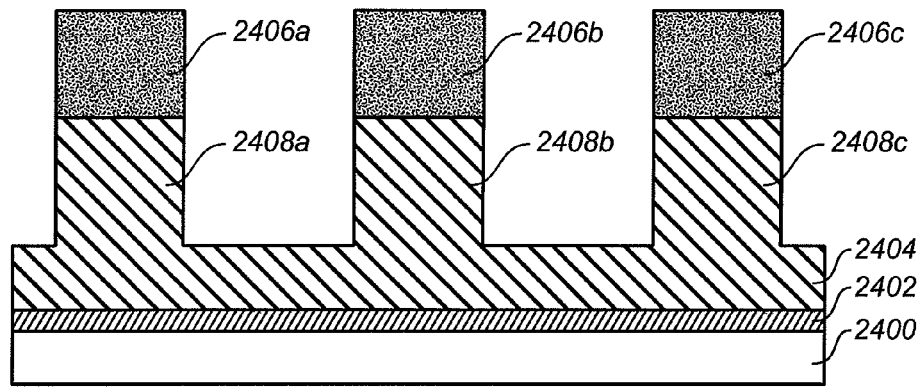
FIG. 24 shows a cross section of a NAND flash memory array at an early stage of fabrication, according to another embodiment of the present invention, with masking portions establishing a pattern for partially etching a floating gate layer.

FIG. 24 shows a cross section of a NAND memory array, along the X-direction, at an early stage of fabrication. A gate dielectric layer 2402 (of Silicon Dioxide in this example) is present on substrate 2400 and a conductive layer 2404 (of doped polysilicon in this example) overlies gate dielectric layer 2402. Conductive layer 2404 may be deposited in a single step to form a uniform layer, or may be deposited in more than one step so that conductive layer 2404 includes, for example, polysilicon of different doping levels in different layers. Masking portions 2406a-c (of Silicon Nitride in this example) extend over conductive layer 2404 in the Y-direction (perpendicular to the cross section shown). Conductive layer 2404 is shaped by etching in the pattern of masking portions 2406a-c. In this case, conductive layer 2404 is not etched all the way through to underlying gate dielectric layer 2402. Etching away of portions of conductive layer 2404 may be done by Reactive Ion Etching (RIE) or some other anisotropic etching means. The width of masking portions 2406a-c of FIG. 24 may be equal to the minimum feature size of the lithographic process used or may be less in some cases. Resist slimming or other means may be used to reduce the width of masking portions 2406a-c. Accordingly, the spaces between adjacent masking portions 2406a-c may be the minimum feature size (F) or may be larger. When etching has removed portions of conductive layer 2404, vertical projections 2408a-c are formed by remaining portions of conductive layer 2404 that are covered by masking portions 2406a-c. Vertical projections 2408a-c later form upper portions of floating gates.

Figure 25:
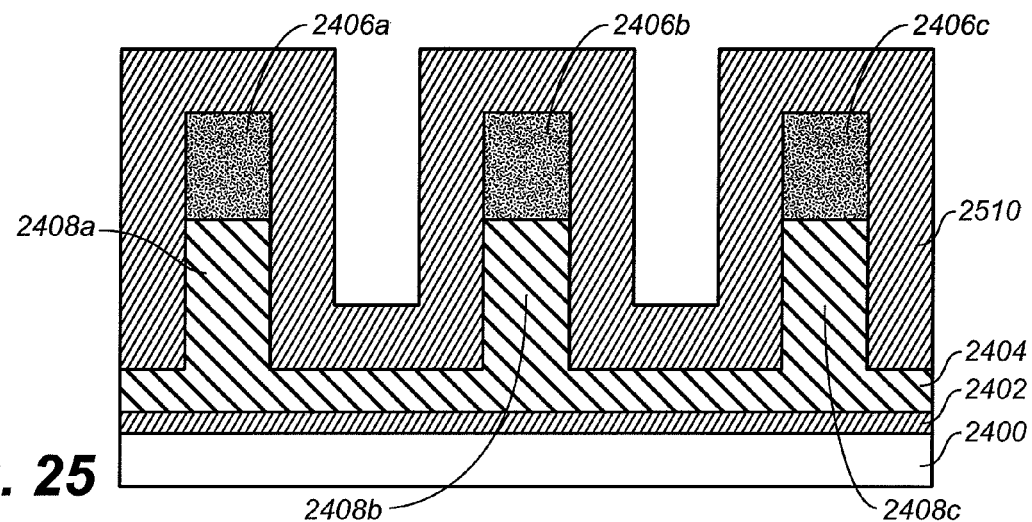
FIG. 25 shows the structure of FIG. 24 after oxidation of the exposed floating gate layer and masking portions.

FIG. 25 shows the structure of FIG. 24 after oxidation is performed to grow a Silicon Dioxide layer 2510 on exposed surfaces of conductive layer 2404 and over exposed surfaces of masking portions 2406a-c. Oxidation of polysilicon of conductive layer 2404 consumes some of the polysilicon to form Silicon Dioxide layer 2510. Thus, as Silicon Dioxide layer 2510 is formed, floating gate layer 2404 is partially consumed and dimensions are reduced. In particular, dimensions of vertical projections 2408a-c along the X-direction are reduced. Similarly, dimensions of masking portions 2406a-c are reduced by oxidation The thickness of Silicon Dioxide layer 2510 and the amount of polysilicon and Silicon Nitride consumed may be controlled by controlling the total oxidation time and controlling process conditions. Suitable processes for oxidizing polysilicon and Silicon Nitride include those that use Oxygen radicals to perform oxidation at relatively low temperatures (less than 500 degrees Centigrade). For example, Decoupled Plasma Nitridation (DPN) or Slot Plane Antenna (SPA) plasma processing systems may be used to oxidize both polysilicon and Silicon Nitride. In an alternative embodiment, resist slimming or other means may be used to form narrow masking portions and vertical projections. Then, a dielectric layer may be deposited over the narrowed masking portions and vertical projections to form structures similar to those of FIG. 25.

Figure 26:
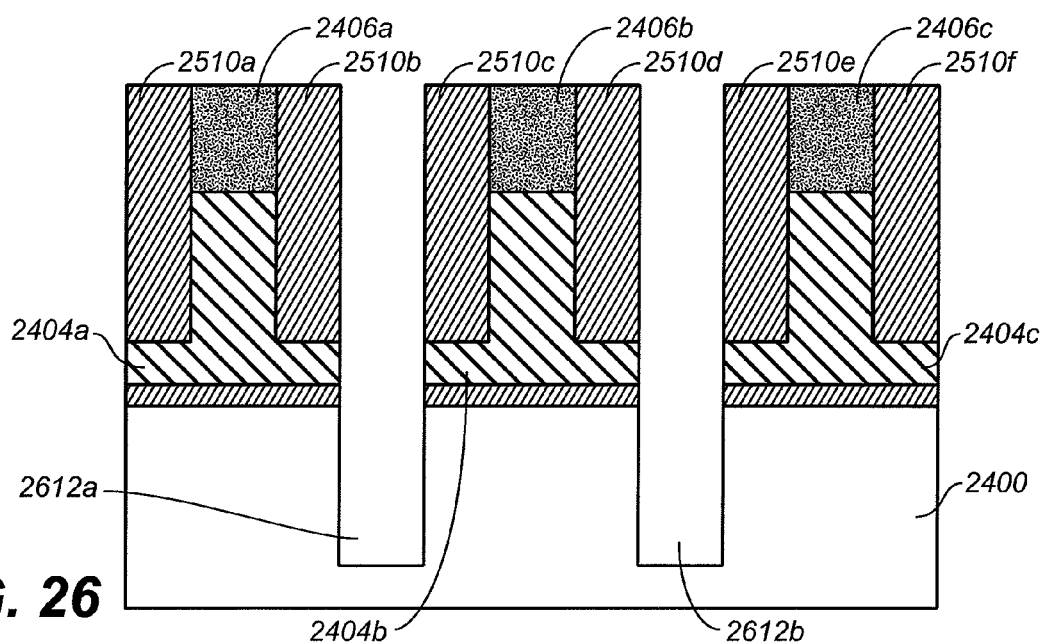
FIG. 26 shows the structure of FIG. 25 after formation of sidewall spacers from the oxide layer and formation of STI trenches using the sidewall spacers to establish the locations of trenches.

FIG. 26 shows the structure of FIG. 25 after anisotropic etching to form trenches 2612a-b for STI structures. Anisotropic etching leaves Silicon Dioxide along sidewalls of vertical projections 2408a-c and masking portions 2406a-c so that sidewall spacers 2510a-f are formed. Silicon Dioxide is etched through between sidewall spacers 2510a-f and a portion of the underlying conductive layer 2404 is then etched through to form separate conductive portions 2404a-c. Subsequently, substrate 2400 is etched to form trenches 2612a-b with sidewall spacers 2510a-f defining locations of the sides of trenches 2612a-b. Etching of Silicon Dioxide layer 2510 and underlying substrate 2400 may be performed as separate etch steps using different chemistry. Trenches 2612a-b are then filled with Silicon Dioxide. Silicon Dioxide may fill trenches 2612a-b beyond the surface of substrate 2400 so that Silicon Dioxide fills the slot between sidewall spacers 2510a-f (also formed of Silicon Dioxide). Subsequently, planarization may be performed to remove masking portions 2406a-c and Silicon Dioxide down to a certain level. Then an etch is performed to remove additional Silicon Dioxide.

Figure 27:
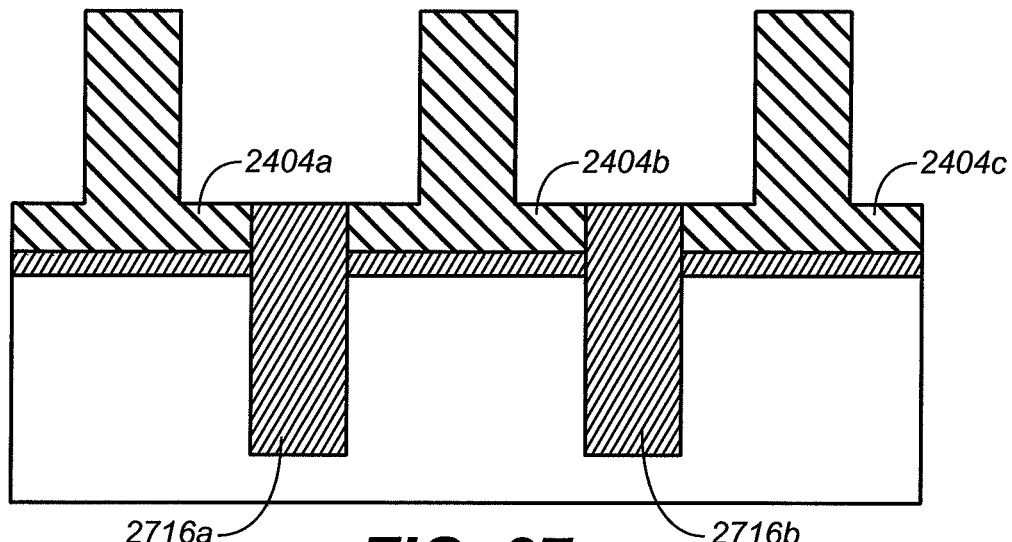
FIG. 27 shows the structure of FIG. 26 after sidewall spacers and masking portions are removed and STI trenches are filled.

FIG. 27 shows the result of planarization and additional etching, so that Silicon Dioxide is removed down to the level of the lower parts of conductive portions 2404a-c, leaving STI structures 2716a-b. In some examples, Silicon Dioxide may be removed to a different level. No masking portions remain at this stage. Planarization may be achieved using a process that stops only after all material of masking portions 2406a-c is removed. In other examples, some material of masking portions 2406a-c may be left after planarization.

Figure 28:
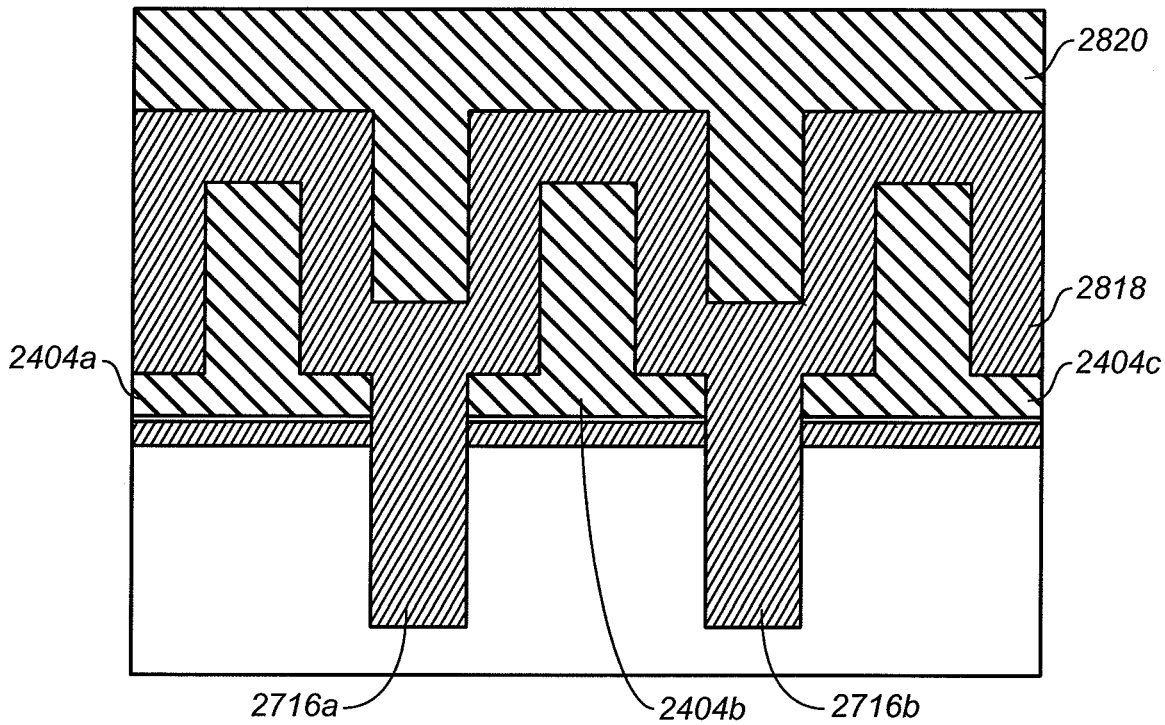
FIG. 28 shows the structure of FIG. 27 after deposition of a dielectric layer and control gate layer.

Subsequently, a dielectric layer 2818 is deposited over conductive portions 2404a-c and a control gate layer 2820 is deposited over dielectric layer 2818 as shown in FIG. 28. Dielectric layer 2818 and control gate layer 2820 are then patterned, as before, to form separate word lines and separate floating gates in a self-aligned manner. STI structures 2716a-b are narrower than floating gates formed from conductive portions 2404a-c in this example, though a range of dimensions is achievable by using different oxidation times and conditions to determine the amount of oxide formed and the amount of underlying polysilicon consumed. Thus, a memory array like that shown in FIG. 2A (though with narrower STI structures) is formed with individual floating gates having an inverted-T shape that is similar to that shown in FIG. 2B.

Figure 29:
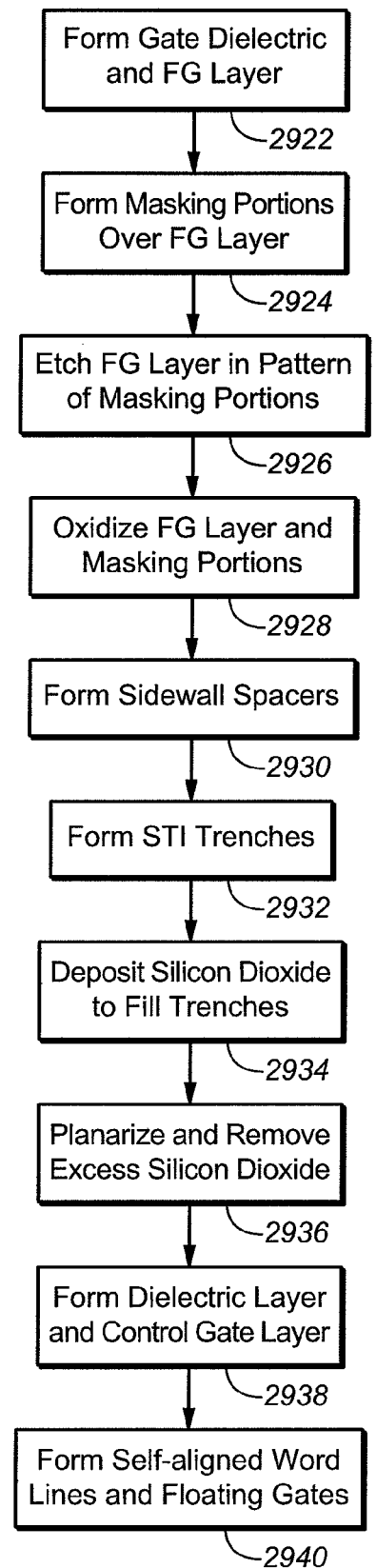
FIG. 29 shows a flowchart of the process described in FIGS. 24-27.

FIG. 29 shows a flowchart that summarizes the process described in FIGS. 24-28. First, a gate dielectric layer and a floating gate (FG) layer are formed over a surface of a substrate 2922. Then, a masking layer is formed over the floating gate layer and is patterned to form masking portions that extend in the Y-direction 2924. The floating gate layer is etched in a pattern established by the masking portions 2926 so that some floating gate material is removed, but the floating gate layer is not etched through at this stage. Then, an oxidation process is performed 2928 to grow Silicon Dioxide on exposed surfaces of the floating gate layer and masking portions. Anisotropic etching is then performed to form sidewall spacers from the Silicon Dioxide grown 2930. These sidewall spacers provide masking for etching the floating gate layer into separate floating gate portions and etch the substrate to form STI trenches 2932. Silicon Dioxide is deposited to fill trenches 2934 and to fill slots between sidewall spacers. Then, a planarization step removes masking portions and some of the Silicon dioxide 2936. More Silicon Dioxide is removed by etching, so that upper portions of floating gates are exposed. Silicon Dioxide remains in trenches to form STI structures. Subsequently, a dielectric layer is deposited and a control gate layer is deposited over the dielectric layer 2938. A patterning process then forms separate word lines and separate floating gates in a self-aligned manner 2940.

Although the various aspects of the present invention have been described with respect to exemplary embodiments thereof, it will be understood that the present invention is entitled to protection within the full scope of the appended claims.

What is claimed is:

1. A method of forming an array of non-volatile memory cells on a semiconductor substrate having a surface, comprising:

forming a dielectric layer on the surface of a substrate;

forming a first conductive layer over the dielectric layer;

forming trenches in the substrate, the trenches separate the first conductive layer into a plurality of first conductive portions, the trenches separate the dielectric layer into a plurality of gate dielectric regions that are self-aligned to the plurality of first conductive portions;

forming a plurality of shallow trench isolation structures in the trenches, the shallow trench isolation structures extend in a first direction and are spaced apart in a second direction that is perpendicular to the first direction;

subsequently forming a plurality of sidewall spacers that extend in the first direction along exposed sidewalls of ones of the plurality of shallow trench isolation structures, the plurality of sidewall spacers overlying first conductive portions;

subsequently forming a plurality of second conductive portions defined by the plurality of sidewall spacers and contacting the first conductive portions; and subsequently removing the plurality of sidewall spacers thereby exposing surfaces of the plurality of first conductive portions and the plurality of second conductive portions.

2. The method of claim 1 wherein an individual one of the plurality of second conductive portions have a dimension along the second direction that is less than a minimum features size of a lithographic process used to pattern the array.

3. The method of claim 1 further comprising forming a dielectric layer and a control gate layer over the exposed surfaces of the plurality of first conductive portions and the plurality of second conductive portions.

4. The method of claim 3 further comprising forming word lines from the control gate layer and forming individual floating gates from the plurality of first conductive portions and the plurality of second conductive portions so that word lines are self aligned to floating gates.

5. The method of claim 4 wherein word lines extend across the substrate in the second direction and are spaced apart in the first direction.

6. A method of forming an array of non-volatile memory cells on a semiconductor substrate having a surface, comprising:

forming a dielectric layer on the surface of a substrate;
forming a first conductive layer over the dielectric layer;
forming trenches in the substrate, the trenches separate the first conductive layer into a plurality of first conductive portions, the trenches separate the dielectric layer into a plurality of gate dielectric regions that are self-aligned to the plurality of first conductive portions;
forming a plurality of shallow trench isolation structures in the trenches, the shallow trench isolation structures extend in a first direction and are spaced apart in a second direction that is perpendicular to the first direction, the plurality of shallow trench isolation structures separated by the plurality of first conductive portions;
subsequently forming a plurality of sidewall spacers that extend in the first direction along exposed sidewalls of ones of the plurality of shallow trench isolation structures, the plurality of sidewall spacers overlying first conductive portions;
deliberately forming a cavity in individual ones of the first conductive portions;
subsequently forming a plurality of second conductive portions defined by the plurality of sidewall spacers and contacting the first conductive portions, forming the plurality of second conductive portions includes filling the cavity in individual ones of the first conductive portions; and
subsequently removing the plurality of sidewall spacers thereby exposing surfaces of the plurality of first conductive portions and the plurality of second conductive portions.

7. The method of claim 6 wherein the forming a cavity in individual ones of the first conductive portions includes etching the first conductive portions after forming the plurality of sidewall spacers.

8. The method of claim 6 wherein an individual one of the plurality of second conductive portions have a dimension along the second direction that is less than a minimum features size of a lithographic process used to pattern the array.

9. The method of claim 6 further comprising forming a dielectric layer and a control gate layer over the exposed surfaces of the plurality of first conductive portions and the plurality of second conductive portions.

10. The method of claim 9 further comprising forming word lines from the control gate layer and forming individual floating gates from the plurality of first conductive portions and the plurality of second conductive portions so that word lines are self aligned to floating gates.

11. The method of claim 10 wherein word lines extend across the substrate in the second direction and are spaced apart in the first direction.

* * * * *